(12) United States Patent
Kitagawa et al.

(10) Patent No.: US 6,176,286 B1
(45) Date of Patent: *Jan. 23, 2001

(54) FILM APPLYING APPARATUS

(75) Inventors: Kenji Kitagawa; Shigeru Yamamoto, both of Chuo-ku (JP)

(73) Assignee: Somar Corporation, Tokyo (JP)

( * ) Notice: Under 35 U.S.C. 154(b), the term of this patent shall be extended for 0 days.

This patent is subject to a terminal disclaimer.

(21) Appl. No.: 09/163,346

(22) Filed: Sep. 30, 1998

Related U.S. Application Data

(63) Continuation-in-part of application No. 09/118,381, filed on Jul. 17, 1998.

(30) Foreign Application Priority Data

Jul. 16, 1998 (JP) .................................................. 10-201807
Aug. 7, 1998 (JP) .................................................. 10-224771

(51) Int. Cl.[7] .................................................. B32B 31/04
(52) U.S. Cl. .......................... 156/555; 156/522; 156/582; 100/176
(58) Field of Search .................................... 156/510, 516, 156/522, 538, 539, 555, 582; 100/155, 160, 176

(56) References Cited

U.S. PATENT DOCUMENTS

| | | | |
|---|---|---|---|
| 4,650,536 | * 3/1987 | Ceraso | 156/364 |
| 4,702,789 | * 10/1987 | Ceraso | 156/256 |
| 4,743,334 | * 5/1988 | Singer | 156/499 |
| 5,019,203 | * 5/1991 | Singer | 156/309.9 |
| 5,125,999 | * 6/1992 | Sumi et al. | 156/281 |
| 5,158,641 | * 10/1992 | Vermeulen et al. | 156/555 |
| 5,716,490 | * 2/1998 | Kuhns et al. | 156/499 |
| 5,746,878 | * 5/1998 | Kuhns et al. | 156/364 |
| 5,853,531 | * 12/1998 | Murphy et al. | 156/555 |

FOREIGN PATENT DOCUMENTS

| | | |
|---|---|---|
| 0-085-793-A2 | 8/1983 | (EP) . |
| 0-401-513-A2 | 12/1990 | (EP) . |
| 57-198693 | 12/1982 | (JP) . |
| B2-2-61024 | 12/1990 | (JP) . |
| B2-4-9656 | 2/1992 | (JP) . |
| 8-323915 | 12/1996 | (JP) . |

* cited by examiner

*Primary Examiner*—James Sells
(74) *Attorney, Agent, or Firm*—Oliff & Berridge, PLC

(57) ABSTRACT

A film applying apparatus 10 is provided with preparatory bonding rolls 20A, 20B and laminating rolls 21A, 21B, and a laminated film 12 wound out from a film roll 18 and a substrate 16 conveyed by a substrate conveying device 14 pass between these rolls and pressure bonding is performed. Diameter of the preparatory bonding rolls 20A, 20B is made smaller than diameter of the laminating rolls 21A, 21B and range of elastic deformable area S1 at the roll surface at grasping starting of the substrate and the laminated film 12 by the preparatory bonding rolls 20A, 20B is made small thereby range of generating, air holding or the like is limited to small.

17 Claims, 14 Drawing Sheets

FILM APPLYING APPARATUS

This application is a continuation in part of U.S. patent application Ser. No. 09/118,381 filed Jul. 17, 1998.

DETAILED DESCRIPTION OF THE INVENTION

1. Field of the Invention

The present invention relates to a film applying apparatus for applying a film to a surface of a substrate exemplified by a substrate for a printed circuit board or a glass substrate of a liquid crystal display device or a plasma display device by laminating rolls.

2. Description of the Prior Art

In a process for the manufacture of printed circuit boards used for electronic equipment such as computers, a laminated film consisting of a light-transmissible support film (a synthetic resin film usually represented by polyester), a photosensitive resin layer formed on the support film and a cover film covering the resin layer is applied onto a conductive surface layer of a substrate for a printed circuit board (substrate width being 610 mm usually and 650 mm at most) after the cover film is removed. And then a circuit pattern film is overlaid, and the photosensitive resin layer is exposed for a predetermined period of time via the circuit pattern film and the light-transmissible support film. Subsequently after the light-transmissible support film is removed, the exposed photosensitive resin layer is developed and an etching mask pattern is formed, and then an unnecessary portion of the conductive layer is removed by etching thereby a printed circuit board having circuit board having a predetermined circuit pattern is formed. Also in a process of forming a display cell onto a glass substrate of a liquid crystal display device or a plasma display device, a similar laminated film is applied thereto.

In some film applying apparatus for applying a laminated film as above described, after a cover film is removed by a film separation member, a continuous film wound on a film supply roll is guided to the leading end of a substrate being conveyed by a conveying means, with the photosensitive resin layer located on the substrate side, and after the continuous film is temporarily tacked to the leading end of the substrate by a tacking means movable toward and away from the substrate, the substrate is conveyed by a lamination roll while the film is pressed to the substrate. The application under pressure of the film to the substrate is achieved so that the length of the application of the film is substantially equal to the length of the substrate, and the supplied film is cut into the predetermined length by a film cutting means disposed on or adjacent to the film tacking means.

The film tacking means as disclosed in JP-B 4-9656 for example, is constituted by a main vacuum plate provided with a plurality of suction holes (grooves) for sucking a film on a surface, and a main body of a film tacking member of circular arc shape or triangular shape disposed to the leading end side in the film supply direction of the main vacuum plate, and the film tacking member as a whole is moved toward and away from the substrate so that the operation of film supply and tacking can be performed.

As another pressure bonding system, there is a system of continuous applying type where while a substrate is conveyed at regular intervals in sequence, a laminated film is supplied without cutting continuously along the conveyed substrate in parallel thereto, and both are sent between a pair of laminating rolls rotating and subjected to the thermal pressure bonding.

In the film applying apparatus of continuous applying type, since the laminated film is wound out from a film supply roll and a cover film is continuously separated and sent in the laminating roll direction, after the winding-out leading end portion of the laminated film in the state of the cover film being removed previously is grasped by a pinch roll usually disposed at the outlet side of the laminating roll via the guide roll and the laminating roll at the inlet side of the laminating roll, or after the winding-out leading end portion of the laminated film is temporarily tacked to the leading end of the leading end substrate by the above-mentioned tacking means, the applying work is started.

When the laminated film is pressure-bonded to the substrate by a pair of laminating rolls as above described, the laminating rolls are heated to the predetermined temperature (about 130° C.) by means of the induction heating or the like, and since the heating of the photosensitive resin layer in the laminated film and the thermal pressure bonding to the substrate are performed simultaneously, there is a problem that the laminated film in the applied state to the substrate is subjected to wrinkles, looseness or holding an air therein.

On the contrary, in JP-A 57-198693 or JP-B 2-61024, two-stage film applying method is proposed where in a laminator for a substrate of a printed circuit board, laminating rolls are constituted in two stages, and in the first stage, pressure bonding is performed at a lower temperature than the thermal pressure bonding temperature and preparatory bonding is performed, and at the second stage, pressure is applied at the thermal pressure bonding temperature and the bonding is completed.

Here, in recent years, in the case of a plasma display substrate for example, its size becomes very large being 700 mm×900 mm, 800 mm×1000 mm or the like, and corresponding to this, also touch length of the laminating roll (the axial length of the region pressing the substrate) naturally becomes as long as that exceeding 700 mm or 800 mm.

When the length (span) of the laminating roll is made large in such manner, also the diameter of the laminating roll becomes large.

The laminating roll is usually formed by applying rubber to the outer circumference of the metal roll, and when the film is applied to the substrate, the contact surface with the film is elastically deformed into a plane shape by the pushing-down force.

Here, in any of the case of the continuous applying and the case that the leading end of the film is applied to the substrate by the tacking member, the pair of laminating rolls are rotated and at the standby state to the position spaced from the substrate conveying plane at the "OPEN" state until the leading end of the substrate enters the pressure bonding position, and when the leading end of the substrate is conveyed into the pressure bonding position slightly exceeding the interaxis point of the pair of laminating rolls, the leading end of the substrate is grasped and the "CLOSE" state is produced and the pressure bonding is started.

This prevents that the laminating roll collides with the edge portion at the leading end of the substrate and pushes back the substrate or the outer circumference of the roll is broken. However, when the pair of laminating rolls start the grasping of the substrate and the film, since the rubber lining applied to the outer circumference of the laminating rolls is elastically deformed mainly in the film thickness direction as above described and the deformation in the direction of pushing out an air between the film and the substrate and stretching wrinkles is little, in the range of contacting with the elastically deformed portion at the substrate grasping state, after the applying, the laminated film is liable to wrinkles, looseness or holding an air therein and this problem could not be solved even by the two-stage film applying method as above described.

Therefore when the substrate becomes very large and corresponding to this, the outer diameter of the laminating roll becomes large as above described, the range liable to the air holding or the like as above described naturally becomes large and the area of the pattern exposable region with respect to the total area of the substrate becomes little, and a problem is produced in that the effective area ratio is significantly decreased.

Further in the region liable to the air holding or the like in the film applying apparatus of continuous applying type, in some apparatus, the cover film and the photosensitive resin layer are half-cut in the film width direction at the adjacent position to the end edge of each substrate and the cover film except for the part corresponding between the substrates is applied to the substrate. In this case, since it is unsuitable that the half cut line is set to the region liable to the air holding or the like, there is a problem that the substrate part and the film part not becoming the pattern exposure region increase and the waste becomes much.

SUMMARY OF THE INVENTION

In view of the above-mentioned problems in the prior art, an object of the present invention is to provide a film applying apparatus wherein after the applying as above described, a region of producing wrinkles, looseness or air holding in a lamination film can be suppressed small.

The present invention is in a film applying apparatus having a substrate conveying device for conveying a plurality of substrates along a substrate conveying plane at intervals in sequence; a film guide means for guiding a laminated film constituted by lamination of at least a photosensitive resin layer onto a light-transmissible support film and having width nearly equal to the substrate width, toward the substrate in the state that the exposed photosensitive resin layer is directed to one surface of the conveyed substrate; and a pair of laminating rolls having an elastic material laminated on the outer circumference and being heated and rotated, for performing the thermal pressure bonding of the laminated film and the substrate at the thermal pressure bonding temperature, while the laminated film and the substrate are grasped and sent, wherein a pair of preparatory bonding rolls having an elastic material laminated on the outer circumference and being rotated are installed at the upstream side of the laminating rolls, for press-bonding the laminated film and the substrate at a temperature lower than the thermal pressure bonding temperature and performing the preparatory bonding, while the laminated film and the substrate are grasped and sent, and the diameter in the preparatory bonding rolls at the side of press-bonding the laminated film to the substrate and the pushing-down force at grasping the laminated film and the substrate are specified so that the range of the elastic deformation into a plane shape contacting with the substrate via the film at the roll surface becomes 5 mm or less in the substrate conveying direction thereby the foregoing objects can be achieved.

Also the present invention is in a film applying apparatus having a substrate conveying device for conveying a plurality of substrates along the substrate conveying plane at intervals in sequence; a film guide means for guiding a laminated film constituted by lamination of at least a photosensitive resin layer onto a light-transmissible support film and having width nearly equal to the substrate width, towards the substrate in the state that the photosensitive resin layer being exposed is directed to one surface of the substrate being conveyed; and a pair of laminating rolls with the touch length being 700 mm or more and having an elastic material laminated on the outer circumference and being heated and rotated, for performing thermal pressure bonding of the laminated film and the substrate at the thermal pressure bonding temperature, while the laminated film and the substrate are grasped and sent, wherein a pair of preparatory bonding rolls having an elastic material laminated on the outer circumference and rotating are installed at the upstream side of the laminating rolls, for press-bonding the laminated film and the substrate at a lower temperature than the thermal pressure bonding temperature and performing the preparatory bonding, while the laminated film and the substrate are grasped and sent, and the diameter in the preparatory bonding rolls at the side of press-bonding the laminated film to the substrate and the pushing-down force at grasping the laminated film and the substrate are specified so that the range of the elastic deformation into a plane shape at contacting with the substrate via the film on the roll surface becomes 5 mm or less in the substrate conveying direction thereby the foregoing objects can be achieved.

Further the present invention is in a film applying apparatus having a substrate conveying device for conveying a plurality of substrates along the substrate conveying plane at intervals in sequence; a film guide means for guiding a laminated film constituted by lamination of at least a photosensitive resin layer onto a light-transmissible support film and having width nearly equal to the substrate width, towards the substrate in the state that the photosensitive resin layer being exposed is directed to one surface of the substrate being conveyed; and a pair of laminating rolls with the touch length being 800 mm or more and having an elastic material laminated on the outer circumference and being heated and rotated, for performing thermal pressure bonding of the laminated film and the substrate at the thermal pressure bonding temperature, while the laminated film and the substrate are grasped and sent, wherein a pair of preparatory bonding rolls having an elastic material laminated on the outer circumference and rotating are installed at the upstream side of the laminating rolls, for press-bonding the laminated film and the substrate at a lower temperature than the thermal pressure bonding temperature and performing the preparatory bonding, while the laminated film and the substrate are grasped and sent, and the diameter in the preparatory bonding rolls at the side of press-bonding the laminated film to the substrate and the pushing-down force at grasping the laminated film and the substrate are specified so that the range of the elastic deformation into a plane shape at contacting with the substrate via the film on the roll surface becomes 5 mm or less in the substrate conveying direction thereby the foregoing objects can be achieved.

In the above-mentioned film applying apparatus, the diameter of the preparatory bonding roll may be made 50–120 mm.

In the above-mentioned film applying apparatus, the diameter of the preparatory bonding roll may be made 0.1–0.8 times of the diameter of the laminating roll.

In the above-mentioned film applying apparatus, the diameter of the laminating roll may be made 110 mm–300 mm.

In the above-mentioned film applying apparatus, the diameter of the laminating roll may be made 110 mm–300 mm, and the diameter of the preparatory bonding roll may be made 0.1–0.8 times of the diameter of the laminating roll.

In the above-mentioned film applying apparatus, the preparatory bonding rolls may be made non-heating rolls.

Also in the above-mentioned film applying apparatus, the preparatory bonding roll may be provided with a backup roll rolling contacting from the reverse side with the substrate in parallel.

In the above-mentioned film applying apparatus, at the downstream side of the laminating roll, a film cutting device may be provided for cutting the laminated film in the width direction at the position projecting from the front and rear ends of the substrate, while the substrate and the laminated film applied to this are conveyed.

In the above-mentioned film applying apparatus, at the position between the preparatory bonding roll and the laminating roll, a film cutting device may be provided for cutting the laminated film in the width direction at the position projecting from the front and rear ends of the substrate, while the substrate and the laminated film applied to this are conveyed, and the laminating roll may be detachably mounted on the film cutting device and the preparatory bonding roll.

In the above-mentioned film applying apparatus, the film guide may be arranged to the upper side and the lower side of the substrate conveying plane, and the laminated film of the upper side and of the lower side is guided by the upper side and the lower side film guide means toward the upper and lower surfaces of the substrate and applied to thereon respectively.

In the present invention, the preparatory bonding roll is set so that range of the elastic deforming area of the roll outer circumference at pushing the film to the substrate becomes small, thereby the preparatory bonding is performed in the state that the region liable to wrinkles, looseness and air holding is little, and other than the above-mentioned region in the preparatory bonding, in the state that the air holding is not produced, the bonding is finished by the thermal pressure bonding in the predetermined laminating rolls. Also since the laminating rolls may be provided at the position spaced from other member such as the tacking member, the outer diameter of the laminating rolls may be made sufficiently large and the film can be bonded securely.

EMBODIMENTS OF THE INVENTION

Embodiments of the present invention will be described in detail referring to the accompanying drawings as follows.

Figure 1:
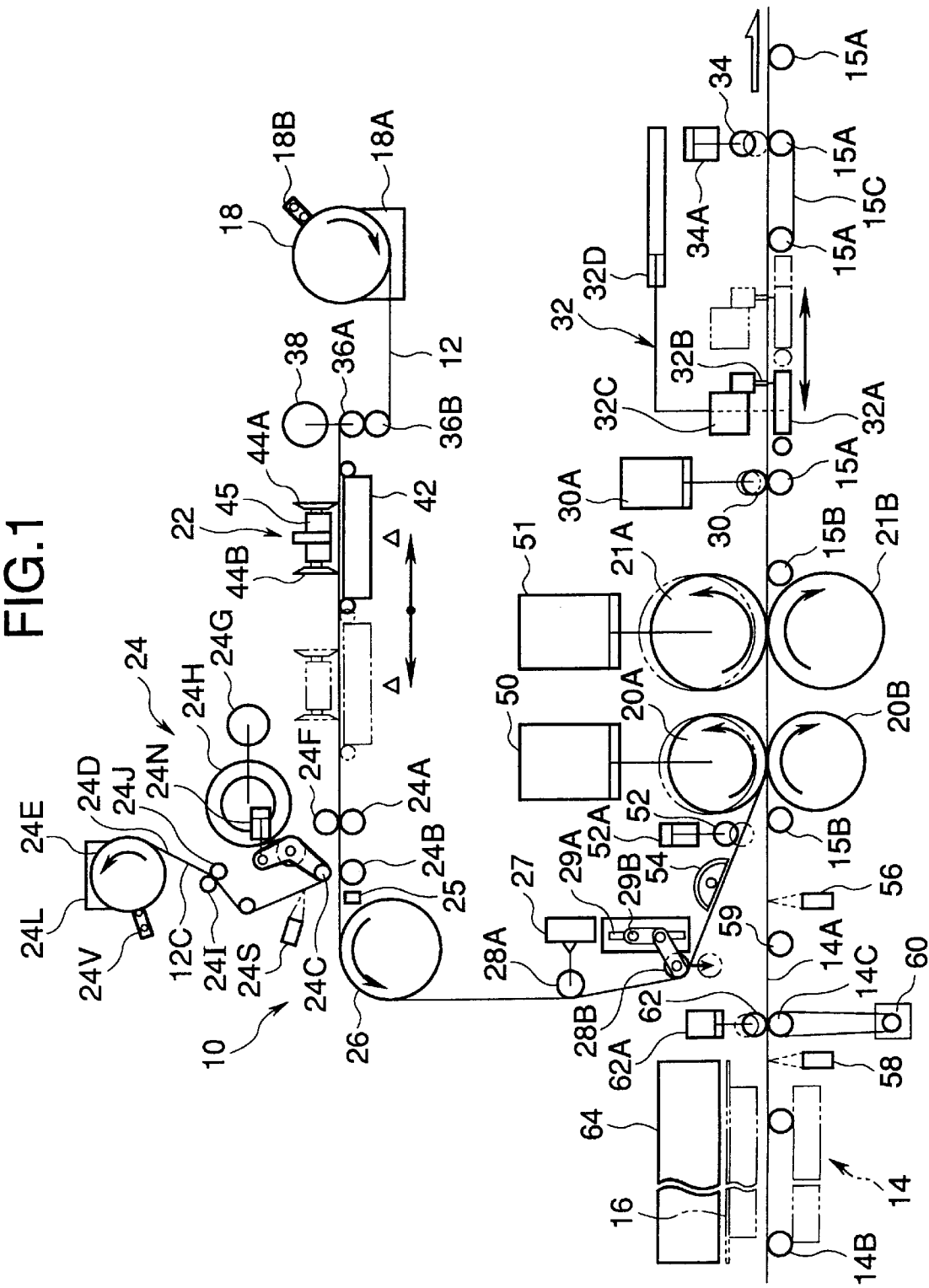
FIG. 1 is a schematic side view showing a film applying apparatus according to an embodiment of the invention.

FIG. 1 shows a film applying apparatus 10 according to an embodiment of the present invention.

The film applying apparatus 10 comprises a substrate conveying device 14 for conveying a plurality of substrates 16 with width being 800 mm or more along a substrate conveying plane 14A at regular intervals in sequence, a film roll 18 where a laminated roll 12 as above described is rolled, and a half cutter 22, a cover film peeling device 24, a suction roll 26, a guide roll 28A in free rotation and a film guide roll 52 arranged between the film roll 18 and preparatory bonding rolls 20A, 20B in this order from the side of the film roll 18, and a cover film 12C of the laminated film 12 wound out from the film roll 18 is cut at the predetermined position by the half cutter 22 and half cutter line is formed. Next, among each half cut interline part of the cover film 12C, only a part to be applied to the substrate 16 is peeled off intermittently by the cover film peeling device 24 and sent between the preparatory bonding rolls 20A, 20B in the state that the photosensitive resin layer 12B is exposed. Here, the exposed photosensitive resin layer 12B is overlaid on the corresponding portion of the substrate 16 conveyed by the substrate conveying device 14, and after the preparatory bonding is performed by the pressure bonding by the preparatory bonding rolls 20A, 20B, further the thermal pressure bonding is performed during passing between a pair of laminating rolls 21A, 21B thereby the bonding is performed completely.

Each of the preparatory bonding rolls 20A, 20B and the laminating rolls 21A, 21B has the touch length (the axial length of the region pressing the substrate) longer than the of the substrate width.

These preparatory bonding rolls 20A, 20B and the laminating rolls 21A, 21B are constituted in that an elastic material 23 (refer to FIG. 14) such as silicone rubber or silicone rubber with a surface coated by a non-adhesive film of fluororesin or the like is provided on outer circumference of a roll made of metal, and a heater (not shown) such as a thermal induction heating device is contained, and before starting the operation of the apparatus, the laminating rolls 21A, 21B are heated until the surface becomes the thermal pressure bonding temperature (100° C.–150° C.), and during the operation, the laminating rolls 21A, 21B are normally rotated.

When the elastic material 23 is rubber, the thickness is preferably made 1.5–3 mm, the rubber hardness is preferably made 500–850 (JIS; by A type hardness scale) 3–30 kg/cm$^2$ and the pushing-down force are 3–50 kg/cm$^2$ in the preparatory bonding rolls 20A, 20B.

Also in the laminating rolls 21A, 21B, the diameter is as sufficiently large as 110–300 mm so that the laminated film 12 solely can be thermally pressure-bonded to the substrate 16 and can be bonded completely. On the contrary, the preparatory bonding rolls 20A, 20B have smaller diameter than that of the laminating rolls 21A, 21B, and the diameter and the pushing-down force are set so that when the substrate 16 and the laminated film 12 are grasped, the range of the roll surface elastically deformed into a plane shape becomes 5 mm or less in the substrate conveying direction.

As above described, in order that the range of the elastic deformation into a plane shape is made 5 mm or less, even if the diameter of the preparatory bonding roll 20A is large, the pushing-down force may be made small. However, if the pushing-down force is small, it may occur that the preparatory bonding can not be performed. Therefore the diameter of the preparatory bonding roll 20A is made 0.1–0.8 times of the diameter of the laminating roll 21A and selection of this and the pushing-down force may be made.

More specifically, when the width of the substrate 16 is 800 mm, the diameter of the preparatory bonding rolls 20A, 20B and the laminating rolls 21A, 21B may be made 84 mm and 110 mm (diameter ratio 0.764), 110 mm and 160 mm (diameter ratio 0.688), 110 mm and 200 mm (diameter ratio 0.55).

Also the preparatory bonding rolls 20A, 20B are normally rotated during the operation, and the surface is heated to a lower temperature than that of the laminating rolls 21A, 21B, for example, about 60° C.

The laminated film 12 is consisting of the photosensitive layer 12B and the cover film 12C laminated in this order on the light-transmissible support film 12A.

As the light-transmissible support film 12, in general, a belt-shaped film (having thickness of 10–20 μm in general) made from polymers of polyethylene terephthalate (PET), polypropylene or the like may be used. The photosensitive resin layer 12B, in general, includes an intermediate layer such as polyvinyl alcohol having thickness of 10–50 μm (may not include it), and in the intermediate layer, a photopolymerization resist layer in thickness of 1–50 μm is formed. The intermediate layer is bonded to the photopolymerization resist layer at the bonding force stronger than that to the light-transmissible support film 12A. In addition, material of the photopolymerization resist is not particularly limited. The cover film 12C comprises a PET film or the like in thickness of 10–50 μm, and is bonded weakly to the photosensitive resin layer 12B.

A first nip roll 30, a full cutter 32 and a second nip roll 34 are arranged at the outlet side of the laminating rolls 21A, 21B in the substrate conveying direction in this order from the side of the laminating rolls 21A, 21B.

A pair of vertical free rolls 36A, 36B are arranged in the vicinity of the outlet side of the film roll 18, and the upper end of the upper free roll 36A and the upper end of the suction roll 26 are positioned on nearly the same horizontal plane.

Also the suction roll 26 has a number of suction holes (not shown) formed on the surface, and due to the negative pressure applied here, the laminated film 12 being wrapped is sucked, and prescribed tension is supplied to the laminated film 12 between the free rolls 36A, 36B and between the preparatory bonding rolls 20A, 20B.

In addition, since the laminated film 12 is wound out in the state that the torque in the film winding direction is imposed to the film roll 18 by a torque motor 18A, tensile force is generated in the laminated film 12 (tension with a suction roll 26 as hereinafter described may be 2–10 Kg preferably about 5 Kg when width of the laminated film 12 is 1000 mm).

Figure 2:
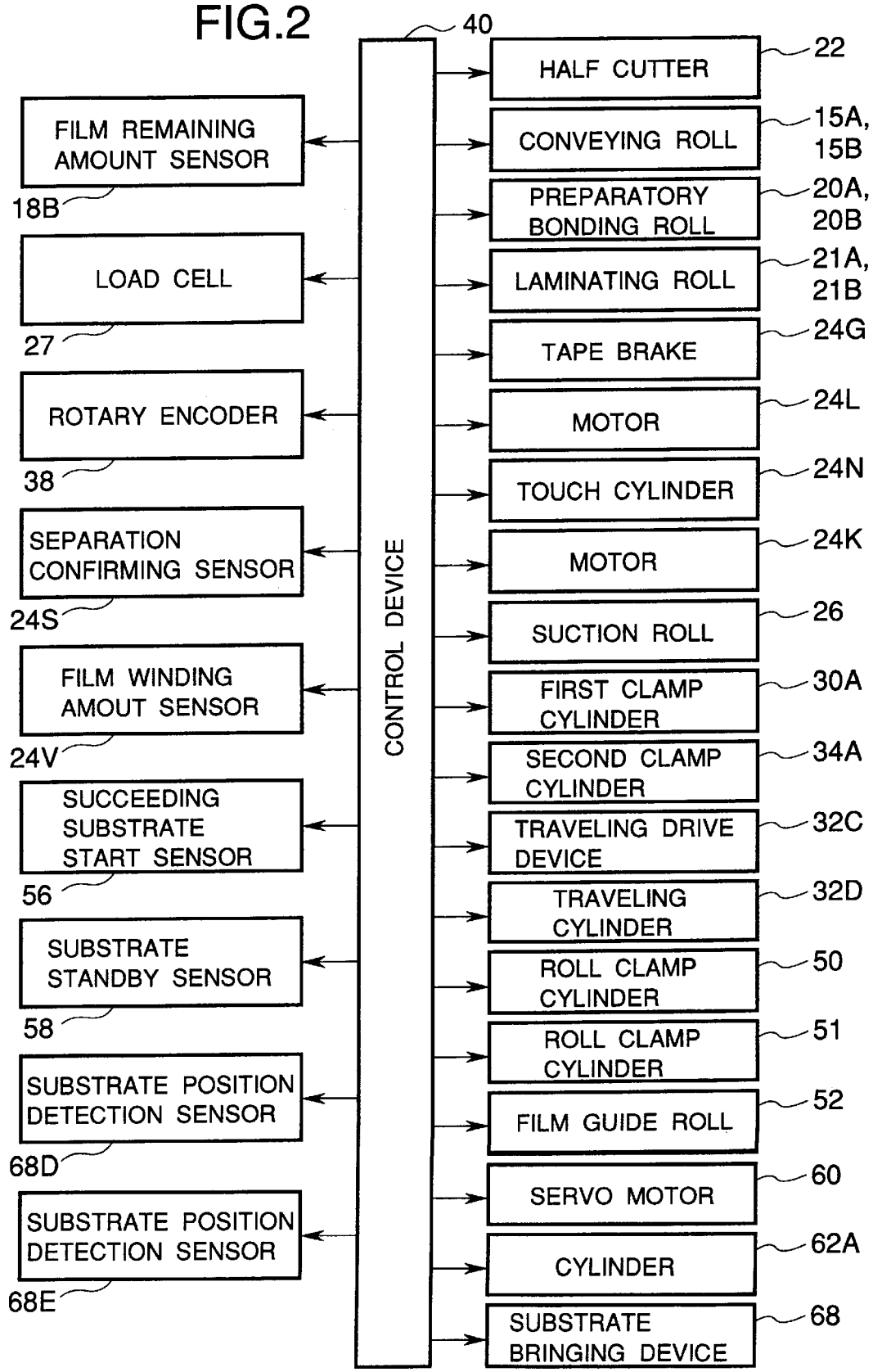
FIG. 2 is a block diagram showing control system of the film applying apparatus.

Also a rotary encoder 38 is connected to the free roll 36A, and pulse is outputted to a control device 40 (refer to FIG. 2) in response to the rotational speed of the free roll 36A when the laminated film 12 is sent in the direction of the suction roll 26.

Figure 3:
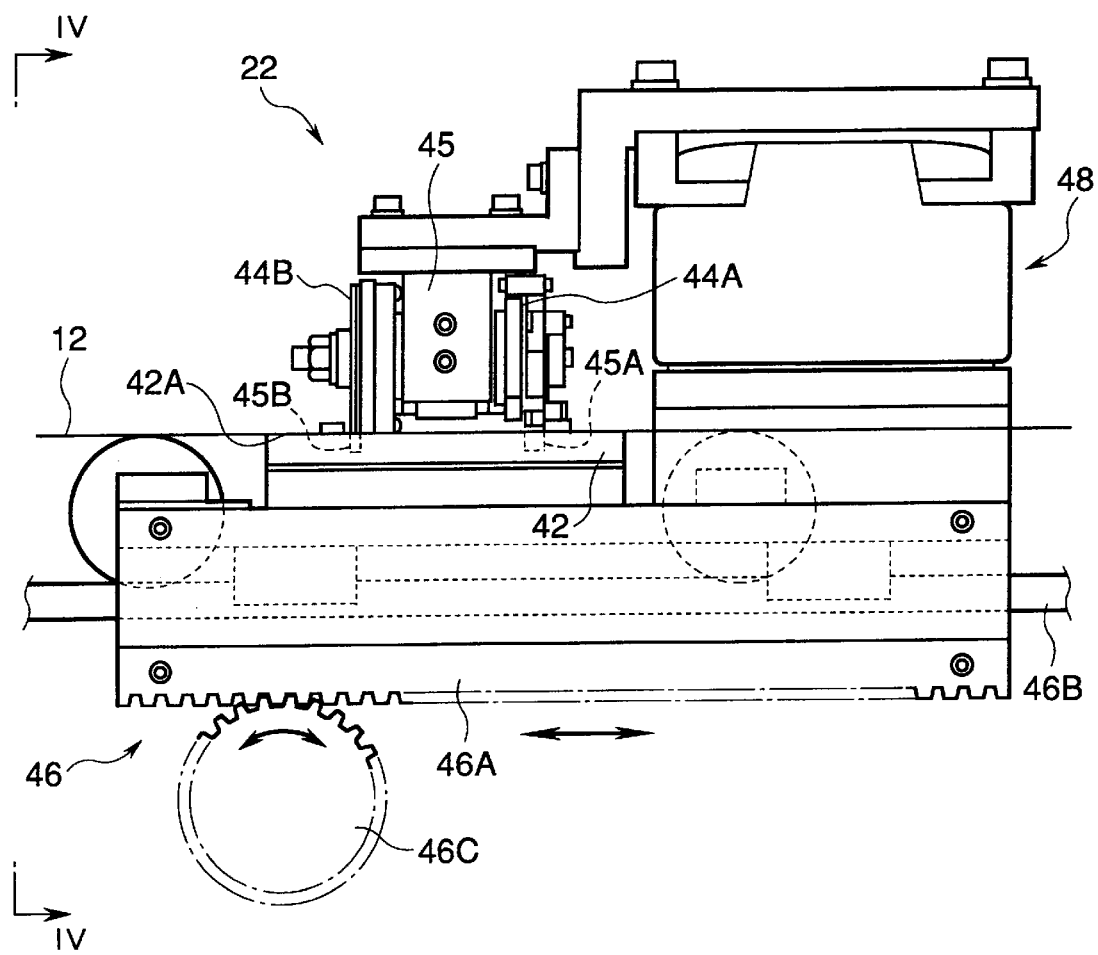
FIG. 3 is an enlarged plan view of a half cutter in the film applying apparatus.
Figure 4:
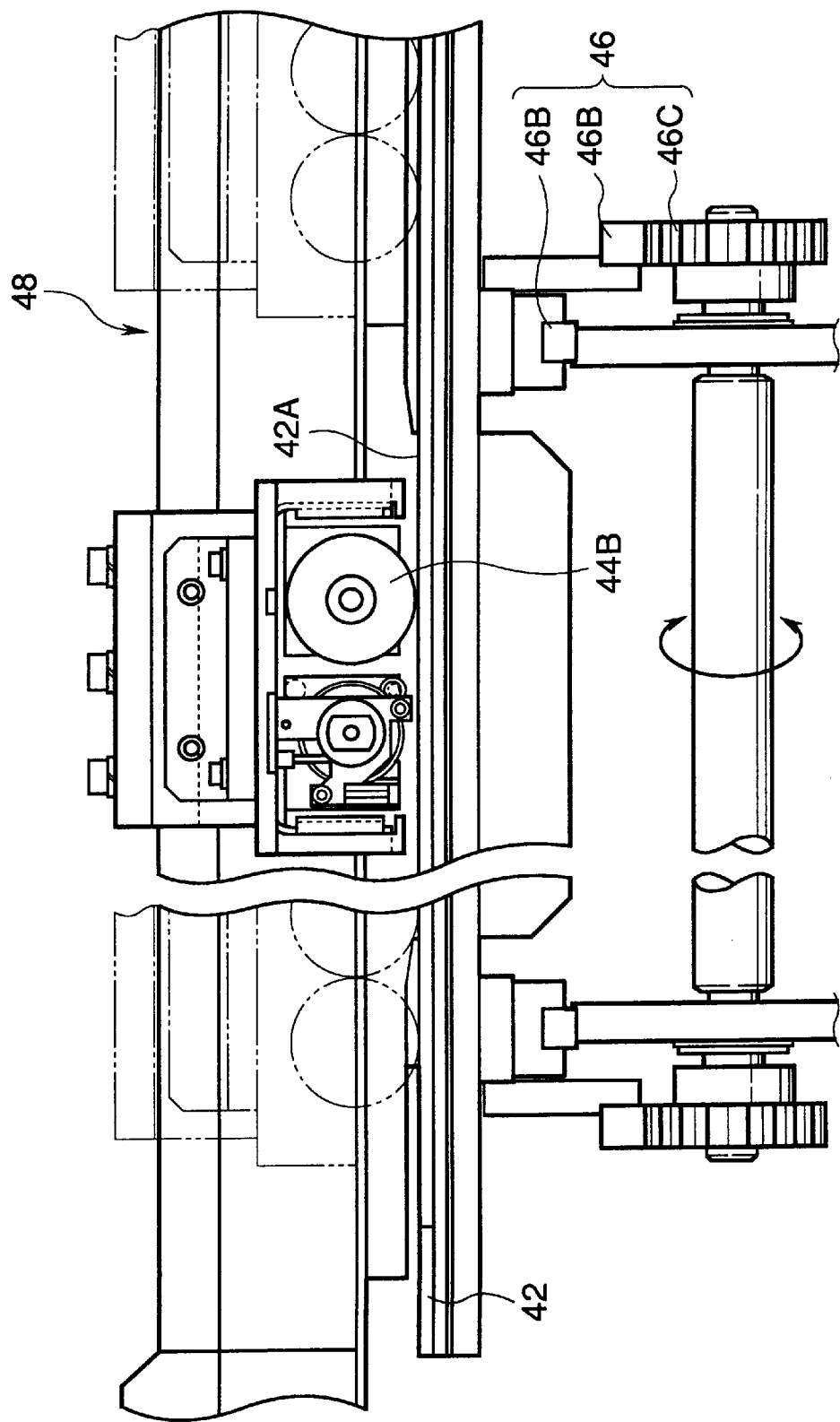
FIG. 4 is a diagram taken on line IV—IV in FIG. 3.

The half cutter 22 as shown in FIG. 3 and FIG. 4 is constituted by a cutter pedestal 42 which is fed between the suction roll 26 and the free roll 36A horizontally and provided with a suction surface 42A substantially coincident with the feed surface of the laminated film 12, and a pair of disk cutters 44A, 44B movable in reciprocation along the upper surface of the cutter pedestal 42 in the film width direction. While the cutter pedestal 42 and the disk cutters 44A, 44B are moved in the feed direction at the equal speed to that of the laminated film 12, the disk cutter 44A, 44B are moved in the film width direction and a cover film 12C and the photosensitive resin layer 12B of the laminated film 12 at the upper surface side in the figure are cut and the light-transmissible support film 12A is slightly cut remaining at least a part thereof in the thickness direction.

Figure 5A:
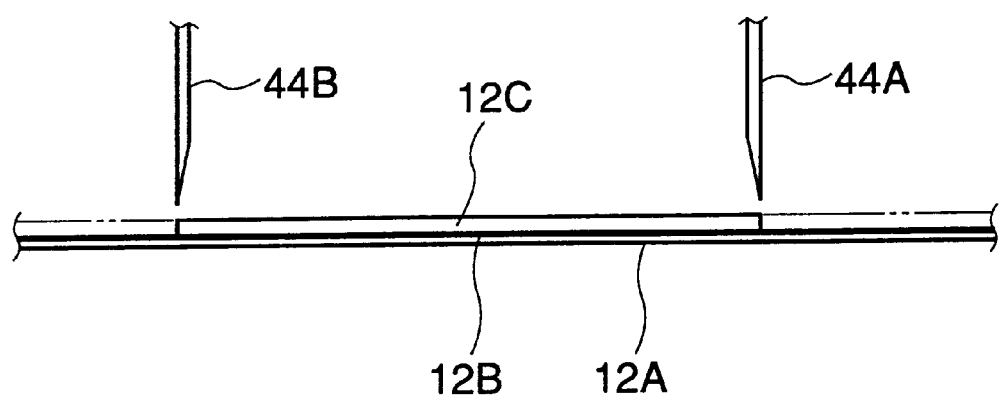
FIGS. 5A and 5B are schematic side views showing in enlargement of position relation of cutting position by the half cutter and a substrate.
Figure 5B:
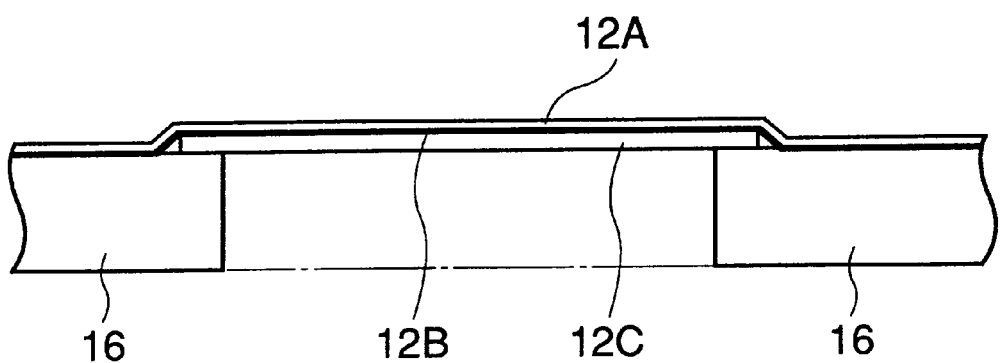

The pair of disk cutters 44A, 44B are spaced in the feed direction of the laminated film 12, and their distance as shown in FIG. 5 is made slightly larger than the distance between the rear end of the preceding substrate 16 and the front end of the succeeding substrate 16 conveyed on the substrate conveying plane 14A.

The reciprocating motion of the cutter pedestal 42 and the disk cutters 44A, 44B in the feed direction of the laminated film is performed by a rack-and-pinion mechanism 46, and the reciprocating motion of the disk cutters 44A, 44B in the film width direction is performed by a one-axis robot 48 respectively, and the rack-and-pinion mechanism 46 and the one-axis robot 48 are controlled by the control device 40.

The rack-and-pinion mechanism 46 is constituted by a rack 46A integral with the cutter pedestal 42, a rail 46B supporting the rack 46A movable in reciprocation in the film feed direction and horizontally, and a pinion 46C meshing with the rack 46A and driving this along the rail 46B. The control device 40 also controls a pulse-motor (not shown) connected to an input shaft of the pinion 46C.

The cutter pedestal 42 is arranged long in the film width direction, and receives tip of the disk cutters 44A, 44B at the upper surface. For example, cutter holders 45A, 45B of rod shape made of synthetic resin are embedded and arranged in the film width direction.

The one-axis robot 48 is arranged on the rack 46A. The one-axis robot 48 has a ball screw mechanism (not shown), and drives the support pedestal 45 supporting the disk cutters 44A, 44B in the film width direction.

Figure 6:
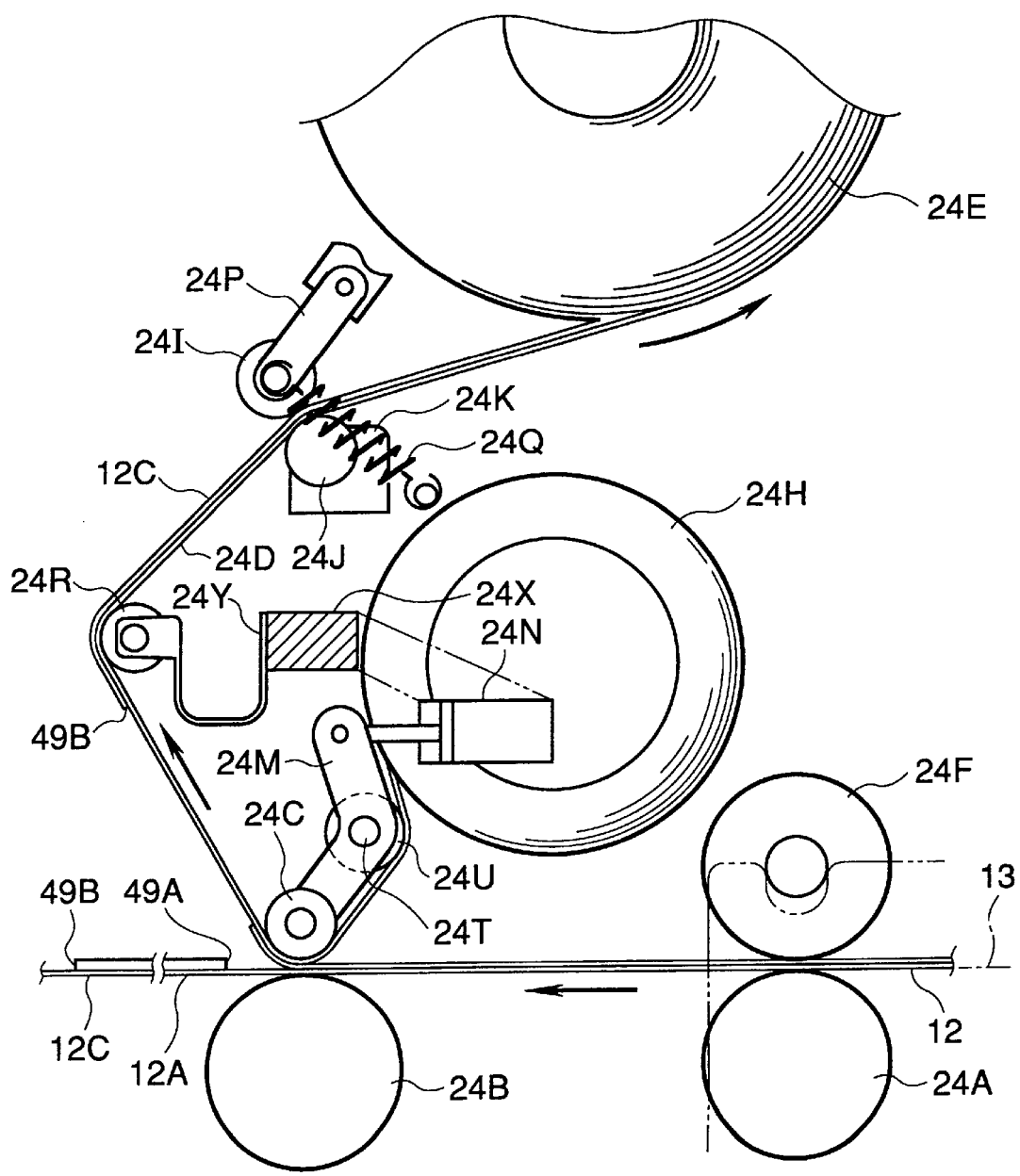
FIG. 6 is a schematic side view showing in enlargement of function of a cover film peeling device in the film applying apparatus.

The cover film peeling device 24 as shown in FIG. 1 and FIG. 6, is provided with holding rolls 24A, 24B contacting with the lower side of the laminated film 12 in the film passing surface 13 at the positions between the half cutter 22 and the suction roll 26, a touch roll 24C detachably contacting from the upper side with the holding roll 24B at the side near the suction roll 26, an adhesive tape 24D having an adhesive layer formed on one surface and wrapped on the touch roll 24C in the state that the adhesive layer is at the lower side in FIG. 1 and FIG. 6, and a winding device 24E for winding the leading end of the adhesive tape 24D.

Numeral 24F designates a nip roll which is disposed on the upper side of the holding roll 24A and grasps the laminated film 12 by its own weight in cooperation with the holding roll 24A and prevents the laminated film 12 from floating when the cover film 12C is pulled upward, numeral 24G designates a tape brake which provides torque in the winding direction to a tape roll 24H being a supply source of the adhesive tape 24D thereby supplies tension to the adhesive tape 24D, numerals 24I, 24J designate nip rolls which grasp the adhesive tape 24D between the touch roll 24C and the winding device 24E, numeral 24K designates a motor which drives the nip roll 24J at speed equal to the feeding speed of the laminated film 12 in the direction of winding the adhesive tape 24D, numeral 24L designates a motor which drives the winding roll in the winding device 24E, numeral 24M designates a rocker lever which supports the touch roll 24C in detachably contacting state with the holder roll 24B, and numeral 24N designates a touch cylinder which drives the rocker lever 24M respectively.

The nip roll 24I is a roll with its surface roughened (usually the surface roughness Ra is about 10 μm). More specifically, its outer circumference is metal, and the metal surface is subjected to blast treatment and mold releasing coating of fluororesin, silicone resin or the like is performed and the photosensitive resin adhering to the adhesive layer of the adhesive tape 24 and the cover film 12C does not adhere.

The touch cylinder 24N is controlled by the control device 40, and among parts between the disk cutters 44A, 44B in the cover film 12C divided by the half cutter 22, in substantially front half part in the film sending direction (arrow direction in FIG. 6), the adhesive tape 24 does not contact, and from substantially rear half part in the film sending direction to the half cut line 49A of the disk cutter 44A at the rear side (the right side in FIG. 6), the adhesive tape 24 contacts and the peeling of the cover film 12 is started from the half cut line 49A, and until the position just before the half cut line 49B of next disk cutter 44B, the touch roll 24C is driven via the rocker lever 24M so that the adhesive tape 24D adheres to the cover film 12C.

The adhesive tape 24D together with the cover film 12C adhered to this, is wound to the winding device 24E via the nip rolls 24I, 24J, thereby the cover film 12C is separated from the photosensitive resin layer 12B.

Accordingly on the light-transmissible support film 12A, as shown in FIG. 5 and FIG. 6, the cover film 12C of equal length remains between the disk cutters 44A, 44B in equal pitch to the conveying pitch of the substrate 16.

Figure 7:
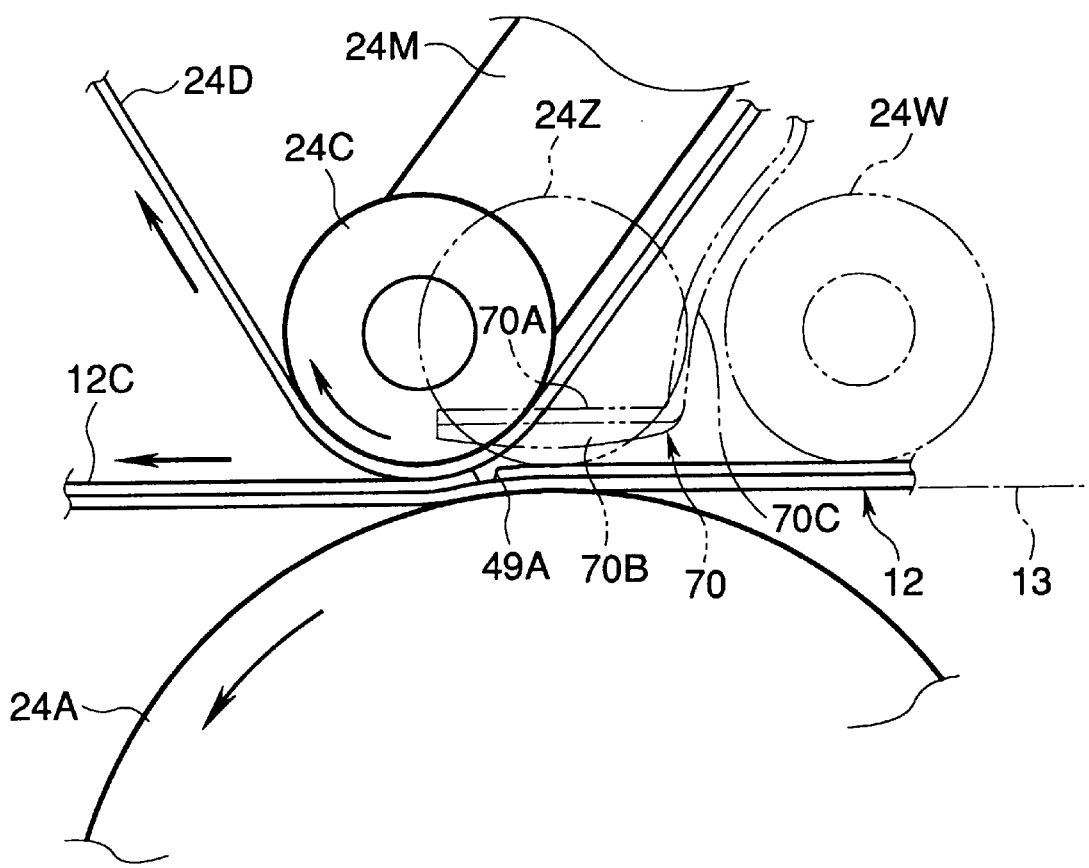
FIG. 7 is a side view showing in enlargement of relation of a touch roll and a laminated film in the cover film peeling device.

In addition, as shown in FIG. 7, the touch roll 24C pushes the cover film 12C from the front side in the traveling direction of the laminated film 12, at the position shifted slightly to the left in the figure from the apex of the holder roll 24B.

Numeral 24P in FIG. 6 designates a lever which supports the nip roll 24I rockable, numeral 24Q designates a spring which energizes the lever 24P in the direction that the nip roll 24I pushes the nip roll 24J, numeral 24R designates a guide roll, numeral 24S designates a separation confirming sensor which confirms whether or not the separated cover film 12C adheres to the adhesive tape 24D, numeral 24T designates a support shaft which supports the rocker lever 24M rockable, and numeral 24U designates a guide roll which is rotatably supported by the support shaft 24T and to which the non-adhesive surface side of the adhesive tape 24S wound out from the tape roll 24H is wrapped, respectively.

Also numeral 24X designates a support bar with both ends mounted on a device frame (not shown) and arranged in parallel to the holder rolls 24A, 24B or the like. The support lever 24X supports the touch cylinder 24N and supports the guide roll 24R rotatable via a plate spring 24Y of U-like shape.

Since the plate spring 24Y is elastically deformed, the guide roll 24R prevents that the adhesive tape 24D becomes slack.

Among the preparatory bonding rolls 20A, 20B and the laminating rolls 21A, 21B, the preparatory bonding roll 20A and the laminating roll 21A at upper side is driven by roll clamp cylinders 50, 51 between the "CLOSE" position where the substrate 16 and the laminated film 12 are pushed down with the preparatory bonding roll 20B and the laminating roll 21B at the lower side and the "OPEN" position spaced upward so as to produce non-contact state with the substrate 16 and the laminated film 12 passing between both.

The first and the second nip rolls 30, 34 are made detachably contacted from upper side with the conveying roll 15A at the lower side by the first clamp cylinder 30A and the second clamp cylinder 34A respectively. The conveying rolls 15A are normally rotated, and when the substrate 16 is moved to the position of the first nip roll 30 or the second nip roll 34, these are pushed down and-grasp the laminated film 12 or the laminated film 12 and the substrate 16 with the conveying roll 15A or the belt 15C to be wound to this, thereby these can be conveyed to the right direction in FIG. 1 by the rotation of the conveying rolls 15A. In addition, the distance between the first nip roll 30 and the second nip roll 34 can be adjusted by relation to the length of the substrate 16, so that when the substrate 16 is conveyed at least one can grasp the substrate 16.

Figure 8:
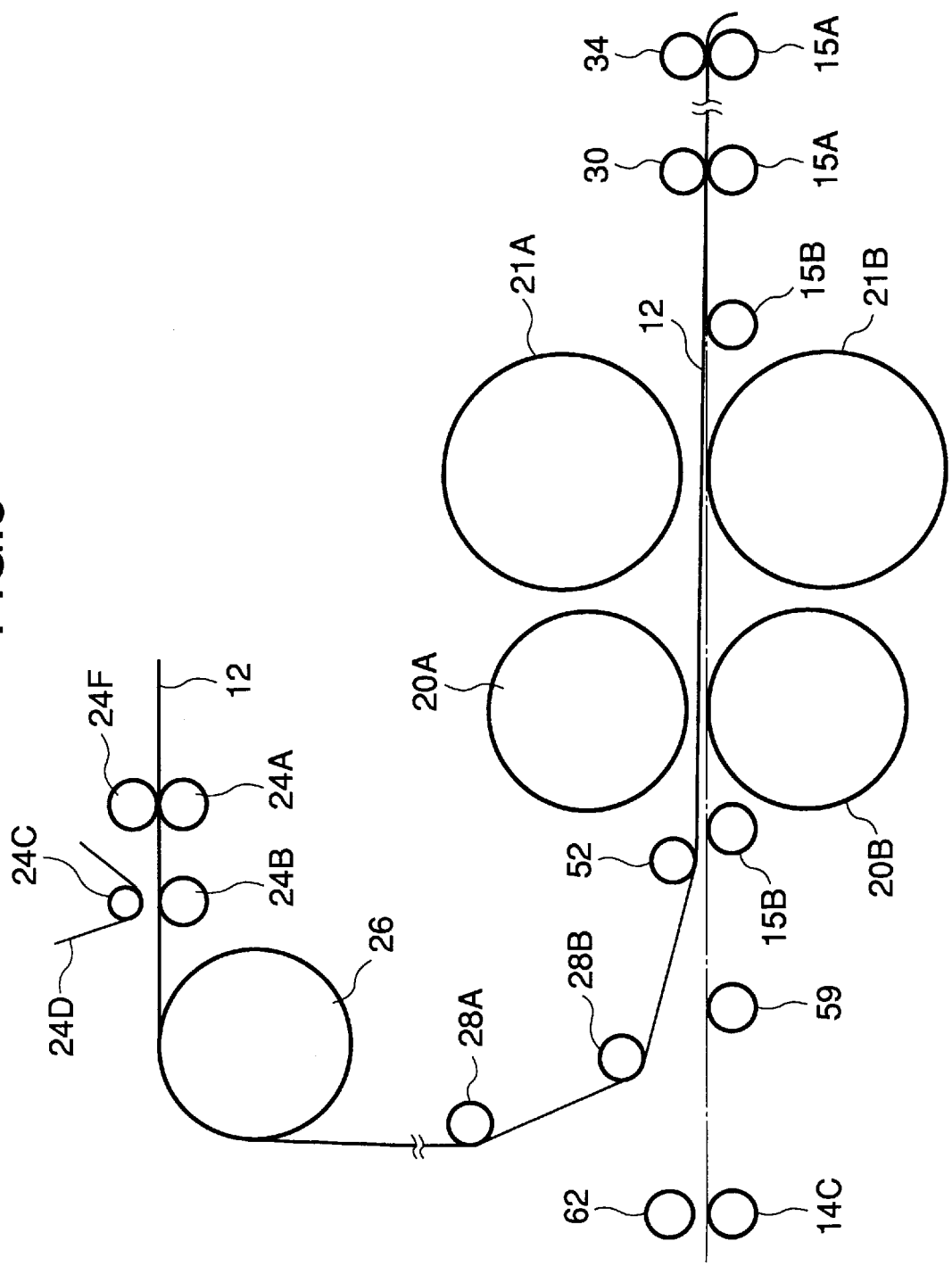
FIG. 8 is a schematic side view showing set state of a winding-out leading end part of a laminated film in the film applying apparatus.

Numeral 15B in FIG. 1 and FIG. 8 designates conveying rolls which are disposed on the front side of the preparatory bonding rolls 20A, 20B and the rear side of the laminating rolls 21A, 21B respectively and rotated at equal speed in synchronization with the conveying roll 15A.

The full cutter 32 is provided with a cutter pedestal 32A moved in reciprocation so as to move along the lower side of the substrate conveying plane 14A in synchronization with the substrate conveying direction and to return in the reverse direction, a cutter edge 32B reciprocated in the substrate conveying direction together with the cutter pedestal 32A and traveling in the film width direction while the cutter pedestal 32A travels in synchronization with the substrate 16 conveyed along the substrate conveying plane 14A for cutting the laminated film 12 with the cutter pedestal 32A, a traveling drive device 32C for traveling the cutter edge 32B in the substrate width direction, a rack-and-pinion mechanism (not shown) interlocked with the substrate conveying device 14 via electromagnetic clutch (not shown) in order that the cutter pedestal 32A, the cutter tip 32B and the traveling drive device 32C are traveled (forward) in synchronization with the substrate conveying direction, and a traveling cylinder 32D for traveling (rearward) the traveling drive device 32C in the reverse direction rapidly. At the rearward moving state, the electromagnetic clutch between the rack-and-pinion mechanism and the substrate conveying device 14 is let "out".

Also numeral 54 in FIG. 1 designates a film heater disposed at the inlet side of the preparatory bonding rolls 20A, 20B for heating the laminated film 12. The film heater 54 is a hot-ray lamp, but when its calorific value is insufficient, it is replaced by a heat roll rotating or a heat plate (plane heater) with large heat generating area.

The film guide roll 52 is disposed at the upstream side of the film heater 54, and changes the film path of the laminated film 12 in non-contact state with both the preparatory bonding rolls 20A, 20B and the laminating rolls 21A, 21B and is arranged rockable so that it is non-contact state with the laminated film 12 during the applying operation by the preparatory bonding rolls 20A, 20B.

At the lower side of the substrate conveying plane 14A, a succeeding substrate start sensor 56 acting also as a substrate rear end sensor is arranged to the position in the vicinity of the inlet side of the preparatory bonding rolls 20A, 20B, and in the position spaced from this at the upstream side, a substrate standby sensor 58 acting also as a substrate front end sensor is arranged, and further at the upstream side of the succeeding substrate start sensor 56, a free roll 59 constituting a part of the substrate conveying plane is arranged.

Numeral 60 in FIG. 1 designates a servo motor for conveyor roll driving so as to drive the conveyor roll 14C in the substrate conveying device 14 and the conveying roll train 14B at the upstream thereof, numeral 62 designates a nip roll for grasping the substrate 16 with the conveyor roll 14C and stabilizing the conveying of the substrate, numeral 62A designates a cylinder for opening and closing the nip roll 62, and numeral 64 designates a temperature holding heater for heating the substrate 16 being conveyed on the substrate conveying plane 14A so that its temperature is not decreased excessively.

Figure 9:
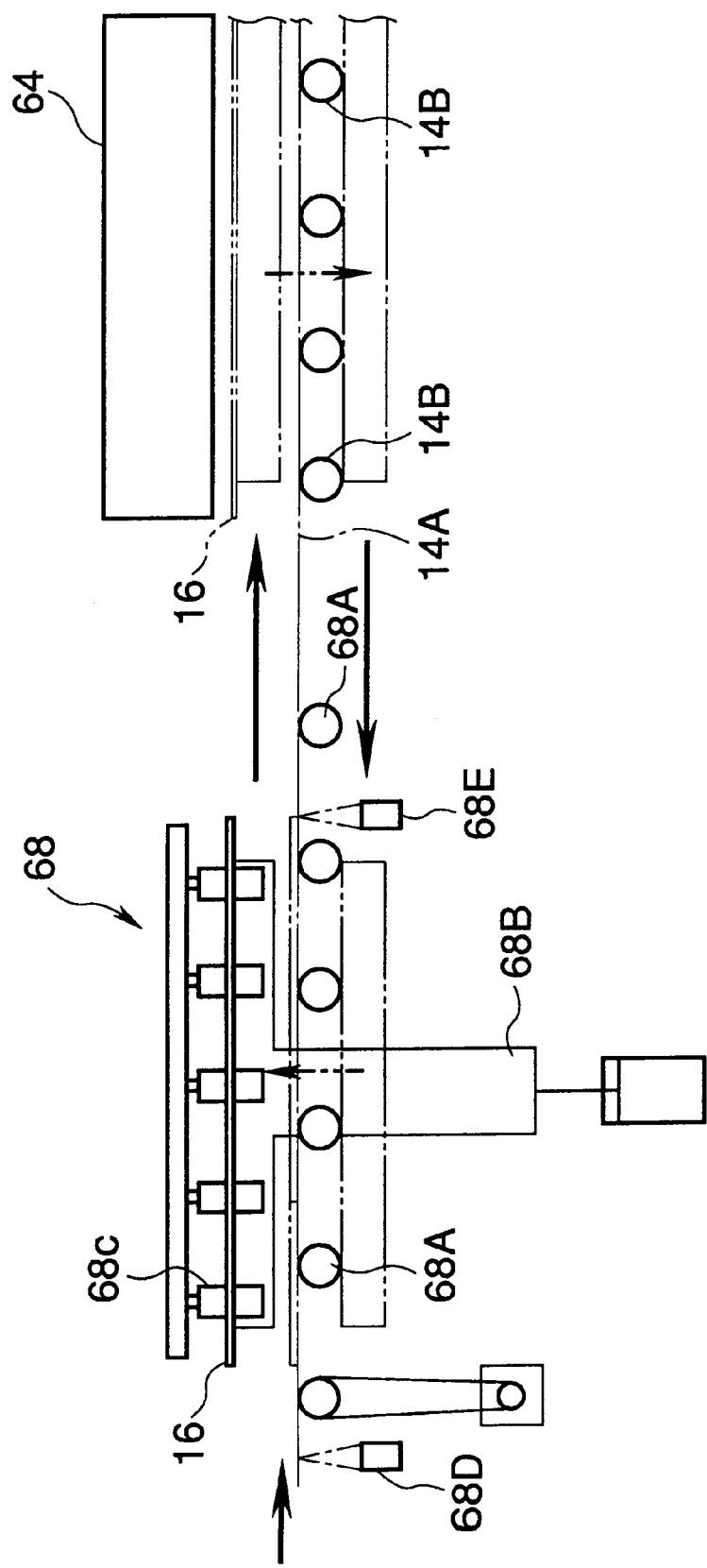
FIG. 9 is a schematic side view showing a substrate bringing device and a temperature holding heater in the film applying apparatus.

At the upstream side of the temperature holding heater 64 along the substrate conveying plane 14A, as shown in FIG. 9, a substrate bringing device 68 is arranged, and further at the upstream side, a substrate heater (not shown) is arranged.

The substrate bringing device 68 is constituted by a conveying roll train 68A, a robot 68B which elevates the substrate 16 conveyed onto the conveying roll train 68A and then sends it horizontally to the lower side of the temperature holding heater 64 and falls and transfers the substrate 16 onto the conveying roll train 14B and returns to the position at the lower side of the conveying roll train 68A, and a bringing roll train 68C which pushes from lateral sides the substrate 16 elevated to the upper side of the conveying roll train 68A by the robot 68B thereby performs the centering in the width direction.

Numeral 68D in FIG. 9 designates a substrate position detecting sensor arranged at the inlet side of the conveying roll train 68A, and numeral 68E designates a substrate position detecting sensor arranged at the outlet side thereof respectively.

The robot 68B is provided with a horizontal substrate putting surface being long in the substrate conveying direction for putting the substrate 16 thereon, and the negative pressure is applied to the substrate putting surface, and a plurality of suction holes (not shown) are provided for sucking the substrate 16 and holding it horizontally and also a heater (not shown) is provided for suppressing the partial cooling of the substrate 16.

The substrate putting surface is made a metal surface, and if necessary, the metal surface may be coated by a non-adhesive film such as fluororesin.

Here the first and the second nip rolls 30, 34 and a nip roll 62 are constituted in that an elastic material such as silicone rubber or silicone rubber with a surface coated by a non-adhesive film such as fluororesin is provided on an outer circumference of a metallic roll.

The nip roll 62 is lowered via the control device 40 by a cylinder 62A based on an output signal when the substrate standby sensor 58 detects the leading end of the substrate, and the nip roll 62 can grasp the substrate with the conveyor roll 14C.

When the succeeding substrate start sensor 56 detects the leading end of the substrate sent onto the substrate conveying plane 14A, the servo motor 60 is made speed "zero" by the control device 40 and stops the substrate temporarily, and next the servo motor 60 is rotated in the timing and the speed so that the substrate 16 is synchronized with the laminated film 12.

In addition, the conveying roll 15A at the downstream side from the laminating rolls 21A, 21B and the conveyor roll 14C at the upstream side, and the conveying roll train 14B and the conveying roll train 68A are independent from each other and the rotation and the stopping are controlled by the control device 40.

Also the negative pressure of the suction roll 26 is adjusted by the control device 40 so that force imposed to the guide roll 28A is detected by the load cell 27 and the detected value, that is, the tensile force given to the laminated film 12 becomes constant.

Numeral 18B in FIG. 1 designates a film remaining amount sensor of the film roll 18, and numeral 24V designates a winding amount sensor in the winding device 24E. Any of these sensors 18E, 24V is a line sensor where a plurality of optical sensors are arranged in radial directions of the roll, and a signal is outputted corresponding to the film remaining amount or the file winding amount.

Next, in the film applying apparatus 10, the leading end of the laminated film 12 is wound out from the roll 18 and passes between the preparatory bonding rolls 20A, 20B and the laminating rolls 21A, 21B and then is set, and next process of applying to the substrate 16 will be described.

Before the laminated film 12 is wound out, the touch roll 24C of the cover film peeling device 24 is at the position where it does not contact with the cover film 12C, and also the film guide roll 52 rocks in the position where the laminated film 12 does not contact with the preparatory bonding rolls 20A, 20B. Also the torque motor 18A is turned ON, and the tensile force is produced while the laminated film 12 is wound out.

Further temperature of the film heater 54 and the temperature holding heater 64 is raised to the predetermined temperature (100–150° C.), and also the laminating rolls 21A, 21B are heated to similar degree and in rotating state normally. Also the preparatory bonding rolls 20A, 20B are heated to a lower temperature than the predetermined temperature.

The leading end of the laminated film 12 wound out from the film roll 18, as shown in FIG. 8, passes between the preparatory bonding rolls 20A, 20B and the laminating rolls 21A, 21B previously opened and is pulled to the position of the first and the second nip rolls 30, 34, and in this state, the first and the second nip rolls 30, 34 are lowered by the first and the second clamp cylinders 30A, 34A and the laminated film 12 is grasped between the nip roll and the conveying roll 15A.

When the film applying work is started, the conveying. roll 15A and the suction roll 26 at the downstream side of the laminating rolls 21A, 21B are driven, and the laminated film 12 is wound out from the film roll 18 and sent.

At the same time, while the half cutter 22 is traveled in synchronization with the laminated film 12, the disk cutters 44A, 44B are driven in the film width direction and the cover film 12C and the photosensitive resin layer 12B are cut.

Then in order that cutting of the cover film 12C and the photosensitive resin layer 12B by the disk cutters 44A, 44B is made complete, the disk cutters 44A, 44B may slightly cut into the light-transmissible support film 12A.

The position of the half cut line of the cover film 12C by the half cutter 22 is seen by the number of pulses outputted from the rotary encoder 38, and also by the pulse signal, the timing of the half cut line 49A by the disk cutter 44A at the right side in FIG. 1 attaining to the position of the touch roll 24C in the cover film peeling device 24 is seen.

According to the time (above-mentioned timing) slightly before this timing, the torque motor 24L and the motor 24K are turned ON by the control device 40, and the adhesive tape 24D is traveled in the nearly equal speed and in the same direction to the laminated film 12 sent in the predetermined speed, then the touch roll 24C is lowered via the touch cylinder 24N by the control device 40, and pushing of the adhesive surface of the adhesive tape 24D wrapped to the touch roll 24C to the cover film 12C is started from the center position in the film sending direction of the non-separation part in the cover film 12C to the position immediately before the half cut line 49A by the disk cutter 44A.

The torque motor 24L and the motor 24K may be turned ON before the tape roll 24 or the film roll 19 is exchanged, or they may be turned OFF/ON corresponding to the rise and fall of the touch roll 24C so as to save the adhesive tape 24D. Since the rotary center axis of the holder roll 24B is slightly shifted to the rear side in the laminated film sending direction from the center axis line of the touch roll 24C in the contacting state to the outer circumference of the holder roll 24B via the laminated film 12 and the adhesive tape 24D, the laminated film 12 contacting with the holder roll 24B becomes a convex curved surface in the side of the cover film 12C and is opened in the part of the half cut line 49A.

Consequently when the adhesive surface of the adhesive tape 24D contacts from the front side of the half cut line 49A, peeling of the cover film 12C is easily started from the position of the half cut line 49A by the disk cutter 44A and the cover film 12C together with the adhesive tape 24D is wound to the winding device 24E.

Here since the adhesive tape 24D is pulled by the nip roll 24J driven by the motor 24K at equal speed to that of the laminated film 12C and the same direction at the touch roll 24C, the adhesive tape 24D touches with or is separated from the cover film 12C thereby variation of the tension given to the laminated film 12 can be made quite small.

In addition, if the pushing start timing of the adhesive surface of the adhesive tape 24D to the cover film 12C is too early in comparison with the above description, the cover film 12C in a part not to be separated will be separated. If it is too late, the separation can not be performed.

Next, from the timing of the cover film 12C separated together with the adhesive tape 24D being grasped by the nip rolls 24I, 24J to the time immediately before the half cut line 49B by the disk cutter 44B produced due to next cutting by the half cutter 22 arriving to the position of the touch roll 24C, the touch roll 24C is driven by the control device 40 in the direction separating from the laminated film 12, and the cover film 12C adhered to the adhesive tape 24D is separated from the laminated film 12 at the position of the half cut line by the cutter 44B.

Thereby the cover film 12C of the position between the half cut lines 49A, 49B by the disk cutters 44A, 44B is not separated but remains on the light-transmissible support film 12A and the photosensitive resin layer 12B and then passes through the suction roll 26 and is sent in the direction of the preparatory bonding rolls 20A, 20B.

In addition, if the timing of separating the touch roll 24C from the laminated film 12 is too early in comparison with the above description, the cover film 12C adhered to the adhesive tape 24D is pulled by the laminated film 12 and may be separated from the adhesive tape 24D. If it is too late, the adhesive tape 24D adheres to the cover film 12C of next part not to be separated and may separate this.

Before the half cut line 49A by the disk cutter 44A on the cover film 12C due to the first cutting approaches the preparatory bonding rolls 20A, 20B, the front substrate 16 passes through the substrate bringing device 68 and is conveyed onto the conveying roll train 14B at lower side of the temperature holding heater 64. If the leading end of the substrate 16 is detected by the substrate standby sensor 58, the nip roll 62 is lowered by the control device 40 in the timing coincident with the top end of the substrate 16 and grasps the substrate 16 with the conveyor roll 14C.

After the conveying roll train 14B and conveyor roll 14C are made conveying speed "zero" by the servo motor 60, in the timing and the speed that the half cut line 49A on the cover film 12C is coincident with the position slightly after the leading end in the sending direction of the front substrate 16, the substrate 16 is sent between the preparatory bonding rolls 20A, 20B by the substrate conveying device 14 in synchronization with the laminated film 12.

The timing of the leading end part of the front substrate 16 attaining to the preparatory bonding rolls 20A, 20B and the laminating rolls 21A, 21B is estimated from relation of the position of the substrate standby sensor 58, the distance between the preparatory bonding rolls 20A, 20B and the laminating rolls 21A, 21B and the conveying speed by the servo motor 60.

In the timing of the leading end of the substrate 16 attaining to the preparatory bonding rolls 20A, 20B estimated in such manner, the preparatory bonding roll 20A at the upper side is lowered by the roll clamp cylinder 50, and the leading end of the front substrate 16 together with the laminated film 12 is grasped between the lowered preparatory roll 20A and the preparatory roll 20B at the lower side and is subjected to the pressure bonding (preparatory bonding) by the rotation of the preparatory bonding rolls 20A, 20B and is sent to the right direction in FIG. 1.

In the timing of the preparatory bonding roll 20A at the upper side lowering, the film guide roll 52 is driven in separating direction from the laminated film 12 in FIG. 1. Thereby the laminated film 12 is grasped by the preparatory bonding rolls 20A, 20B.

Next in the timing that the leading end of the front substrate 16 passing through the preparatory bonding rolls 20A, 20B attaining to the laminating rolls 21A, 21B, the laminating roll 21A at the upper side is lowered by the roll clamp cylinder 51 and the leading end of the substrate 16 together with the laminated film 12 is grasped between the laminating rolls 21A, 21B and is subjected to the thermal pressure bonding to the predetermined temperature due to the rotation of these and is sent out to the right direction in FIG. 1 and the film applying is finished.

Figure 10:
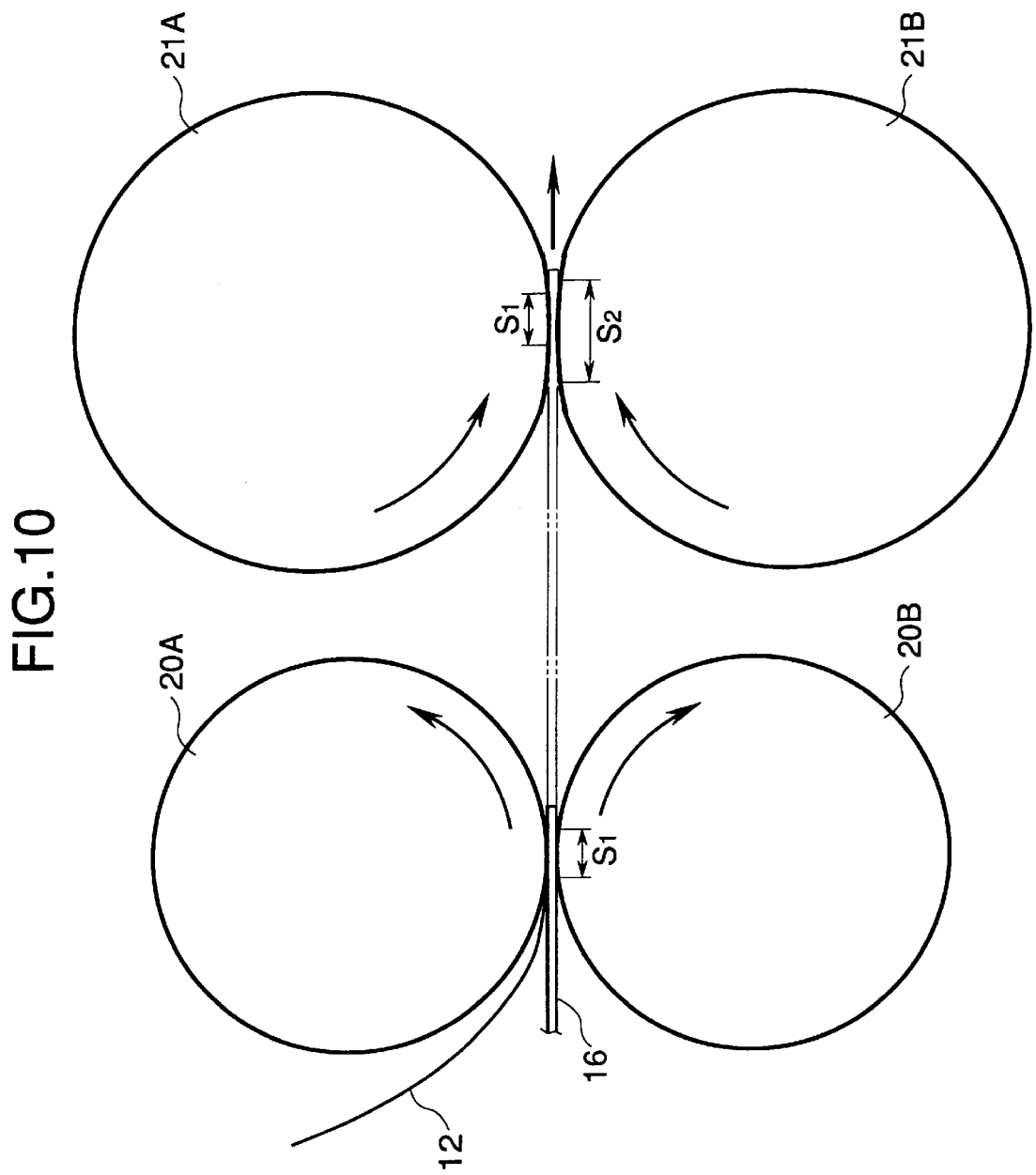
FIG. 10 is a schematic side view showing relation of elastic deforming area of preparatory bonding rolls and laminating rolls and a substrate in a film applying apparatus.

As shown in FIG. 10, the preparatory bonding rolls 20A, 20B have the diameter smaller than that of the laminating rolls 21A, 21B, and the diameter and the pushing-down force are specified so that range of the elastic deformation area S1 of the contact surface of the elastic material 23 on the outer circumference of the preparatory bonding rolls 20A, 20B with the laminated film 12 begun to be deformed flat is made 5 mm or less in the substrate traveling direction, when the preparatory bonding rolls 20A, 20B grasp the substrate 16 and the laminated film 12. Consequently the region liable to generating an air bubble holding, winkles, looseness is small, and the preparatory bonding is performed.

Since the temperature of the preparatory bonding rolls 20A, 20B are set lower than the thermal pressure bonding temperature, the substrate 16 and the laminated film 12 are not fixedly bonded while they pass through the preparatory bonding rolls 20A, 20B.

The substrate 16 and the laminated film 12 subjected to the preparatory bonding by the preparatory bonding rolls 20A, 20B are grasped by the laminating rolls 21A, 21B heated to the predetermined temperature as above described, and are completely bonded while passing between both. Then in the region after the elastic deformable area S1 of the elastic material 23, since the substrate 16 and the laminated film 12 are contacted not strongly but uniformly due to the preparatory bonding by the preparatory bonding rolls 20A, 20B, even within the elastic deformable area S2 where the elastic material 23 of the laminating rolls 21A, 21B starts the deformation, air holding or the like does not occur, and the laminated film 12 can be applied between the substrate 16 by sufficient contacting force.

Accordingly only the elastic deformable area S1 of the preparatory bonding rolls 20A, 20B becomes a range liable to air holding or the like, thereby decrease of the pattern exposure region is little.

Also the position of the half cut line 49A of the cover film 12C need not be significantly shifted to the rear side from the leading end of the substrate 16 and there is no waste.

In addition, when the laminated film 12 is press-bonded to the substrate 16 using the laminating rolls 21A, 21B solely, in the pushing-down force sufficient for the bonding, range of the elastic deformable area S2 in the elastic material 23 of the laminating rolls 21A, 21B in the substrate traveling direction is about 6 mm when the roll diameter is 110 mm and about 20 mm when the roll diameter is 300 mm.

Regarding the second substrate 16 and so forth succeeding the first substrate 16, while the substrates succeeding the first substrate 16 are conveyed at prescribed intervals by the substrate conveying device 14, the cover film 12C in the part to be applied to the substrate is separated in sequence by the cover film peeling device 24, and both are bonded by thermal pressure bonding while passing between the preparatory bonding rolls 20A, 20B and the laminating rolls 21A, 21B. The preparatory bonding roll 20A and the laminating roll 21A at the upper side are made "OPEN" state by the roll clamp cylinders 50, 51 at the gap position between the substrates 16 conveyed intermittently, and they are lowered and made "CLOSE" state at the time of the leading end of the substrate 16 attaining there.

In addition, the laminated film 12 at the leading end side in the sending direction from the part applied to the substrate 16 is sent from the position of the second nip roll 34 to the lower side than the substrate conveying plane 14A in the state that the cover film 12C is applied, and when the laminated film 12 is cut by the full cutter 32 in the slightly front position from the leading end of the first substrate 16, the laminated film 12 is wasted downward from the second nip roll 34.

Accordingly since the cover film 12C remains being applied to the part from the winding-out leading end of the laminated film 12 wound out from the film roll 18 to the cut position by the half cutter 22 when the leading end of the laminated film 12 is set to the position passing through the second nip roll 34, the photosensitive resin layer 12B is not exposed or the exposed photosensitive layer 12B adhere to the nip roll or the like or wrapped around this after starting the operation.

In the prior art, the cover film 12C is peeled off from the winding-out leading end of the laminated film 12 wound out from the film roll 18 and setting is performed where the photosensitive resin layer 12B is exposed. However, since the photosensitive resin layer 12B deteriorates due to oxygen in the air at lapse of about 30 seconds after the cover film 12C is peeled off, in this range, the photosensitive resin layer 12B is wasted without applying to the substrate 16.

In the above-mentioned embodiment, the diameter of the preparatory bonding rolls 20A, 20B is made 50 mm at least. This is determined from that when the laminating roll is eated, a heater such as an induction heating device must be installed within it. The minimum diameter is 30 mm when the heater is not installed. This is the limit value when the deflection due to the pushing-down force is made the definite value or less. If the diameter is still made smaller, the deflection is liable to be generated.

Figure 11:
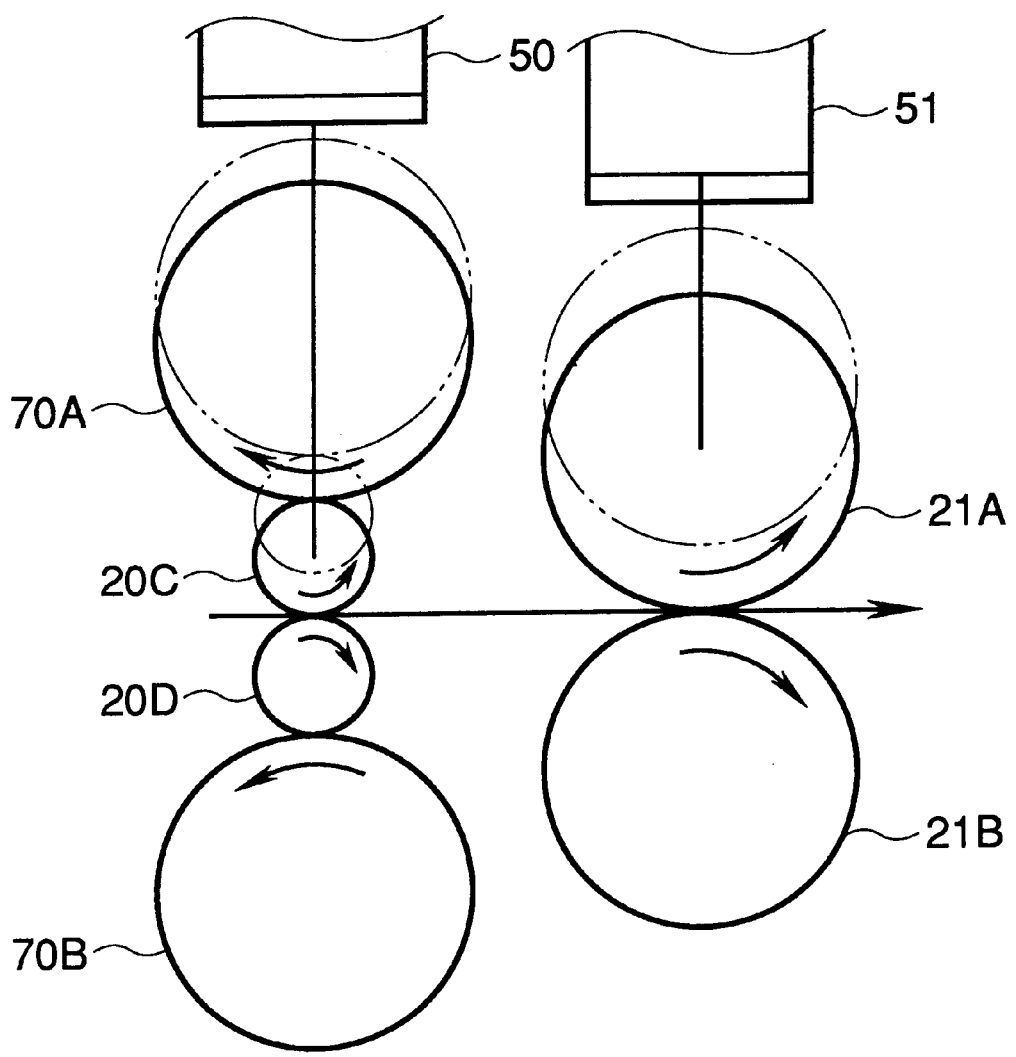
FIG. 11 is a perspective view showing another embodiment of preparatory bonding rolls in a film applying apparatus.

Also in any of the case that the heater is installed in the preparatory bonding roll or the case that it is not installed, for example, as shown in FIG. 11, the preparatory bonding rolls 20C, 20D with smaller diameter may be supported by the backup rolls 70A, 70B with larger diameter from the upper side and the lower side of the preparatory bonding rolls 20C, 20D.

In this case, the preparatory bonding rolls 20C, 20D are constituted in that rubber is coated on the outside of a metal roll in similar to that of the preparatory bonding rolls 20A, 20B, and the backup rolls 70A, 70B may be a metal surface.

In addition, the laminating roll 20C and the backup roll 70A at the upper side are synchronized individually and rotated and driven, and are driven to the "OPEN" position and the "CLOSE" position simultaneously by the roll clamp cylinder 50.

The preparatory bonding rolls 20C, 20D with smaller diameter in the case of sole use is liable to be deflected during the pushing down, but since the preparatory bonding rolls 20C, 20D are backed up by the backup rolls 70A, 70B with larger diameter, the deflection is not generated.

In the prior art, the outer circumference of the laminating roll directly contacting with the laminated film 12 is formed by elastic material liable to abrasion, such as rubber. However, since it is abraded in a short time, there is a problem that the laminating roll must be replaced frequently and the running cost becomes excessive.

On the contrary, since the backup rolls 70A, 70B in FIG. 11 do not contact with the laminated film 12 directly, the whole body may be constituted by metal and the anti-abrasion property can be improved significantly. In this case, the preparatory bonding rolls 20C, 20D with small diameter coated by rubber must be exchanged in a short time, but since it is of small diameter, the cost is low and the exchanging is easy.

When the substrate width exceeds 800 mm, the laminating rolls 21A, 21B may be provided with a backup roll.

Although the preparatory bonding rolls 20A, 20B in FIG. 1 and the preparatory bonding rolls 20C, 20D in FIG. 11 have the equal diameter in the upper side and the lower side, the present invention is not limited to this but only the side contacting with the laminated film 12 may be made smaller diameter.

In the case of the film applying apparatus 10, although the winding-out leading end part of the laminated film 12 wound out from the film roll 18 is grasped by the nip roll and set, the preparatory bonding roll 20A at the upper side may be lowered and the laminated film 12 may be grasped with the preparatory bonding roll 20B at the lower side.

Further the wrapping angle of the laminated film 12 to the preparatory bonding roll 20A is about 30° as shown in FIG. 1, but this may be made large about in range from 30° to about 120°. In the prior art, when the film is thin, since the film is badly affected by the heat of the laminating roll, the wrapping angle is made as small as possible. In the present invention, however, since the temperature of the preparatory bonding roll 20A can be made lower than the thermal pressure bonding temperature, the wrapping angle can be made large. In addition, when the wrapping angle is 90° or more, the film guide roll 52 is displaced around the center axis line of the preparatory bonding roll 20A so that it does not interfere with the laminated film 12 at the standby state.

Further more in the film applying apparatus 10, although relation of the laminating rolls 21A, 21B and the preparatory bonding rolls 20A, 20B is fixed, the laminating rolls 21A, 21B may be detachably mounted.

Figure 12:
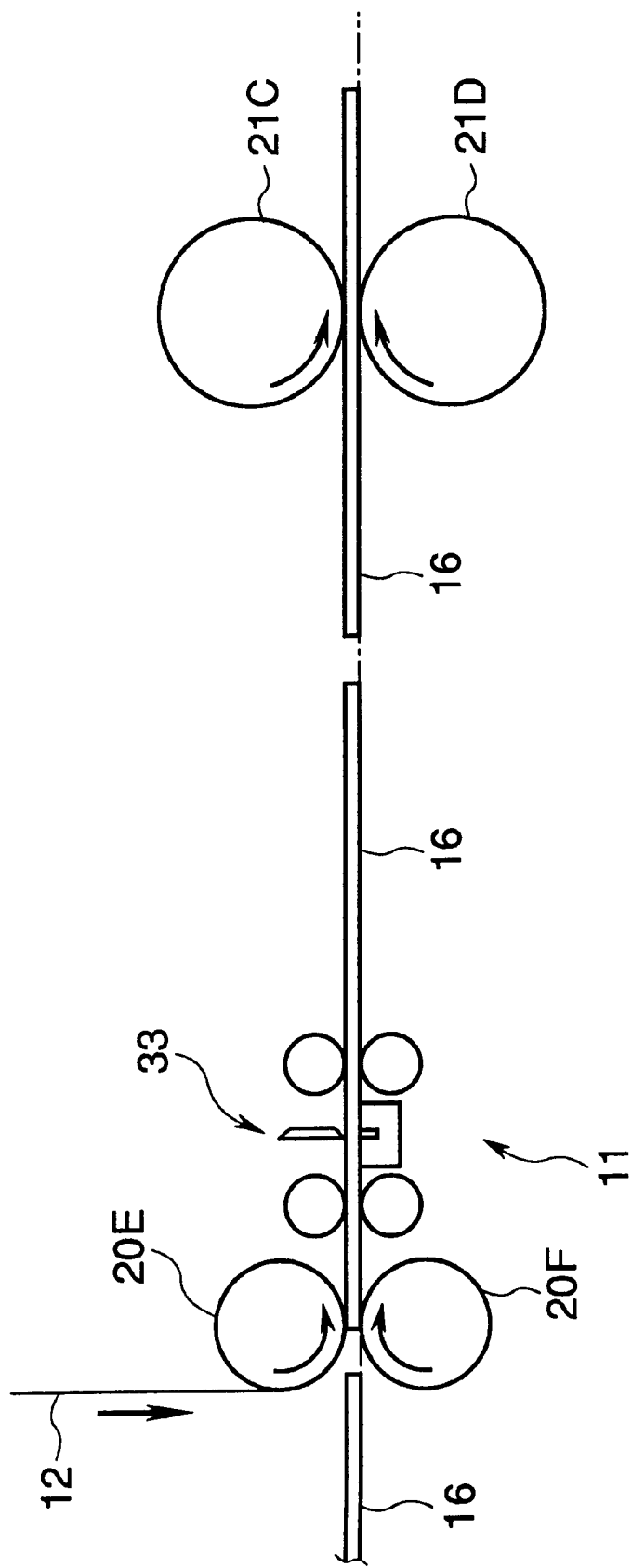
FIG. 12 is a schematic side view showing main part of still another embodiment of a film applying apparatus.

For example, as shown in FIG. 12, the laminating rolls with smaller diameter in the film applying apparatus for a printed circuit board in the prior art maybe made preparatory bonding rolls 20E, 20F in the present invention and laminating rolls 21C, 21D with larger diameter may be connected and arranged to the outlet side of the film applying apparatus thus the film applying apparatus 11 of the present invention may be constituted.

In this case, the full cutter (film cutting device) 33 is arranged at the outlet side of the preparatory bonding rolls 20E, 20F. The laminating rolls 21C, 21D are mounted at the outlet side of the full cutter 33 at the after attachment or mounted to other frame (pedestal) and arranged at the outlet side of the full cutter 33.

Also peeling means of the cover film 12C is not limited to the adhesive tape but an adhesive roll or a suction device by negative pressure, for example, a suction roll with a number of suction holes and negative pressure is imposed thereto may be used.

In the film applying apparatus 10, although the cover film 12C is cut by the half cutter 22 and then the cover film 12C is separated intermittently, the present invention is not limited to this but may be applied also regarding the case that the whole cover film 12C is continuously separated and applied to the substrate 16.

In this case, the half cutter 22 cuts the cover film 12C at one position in the width direction by the first cutting operation of one time after the film is set, and the-peeling start line is formed and the cutting is only one time regarding one film roll 18.

Figure 13:
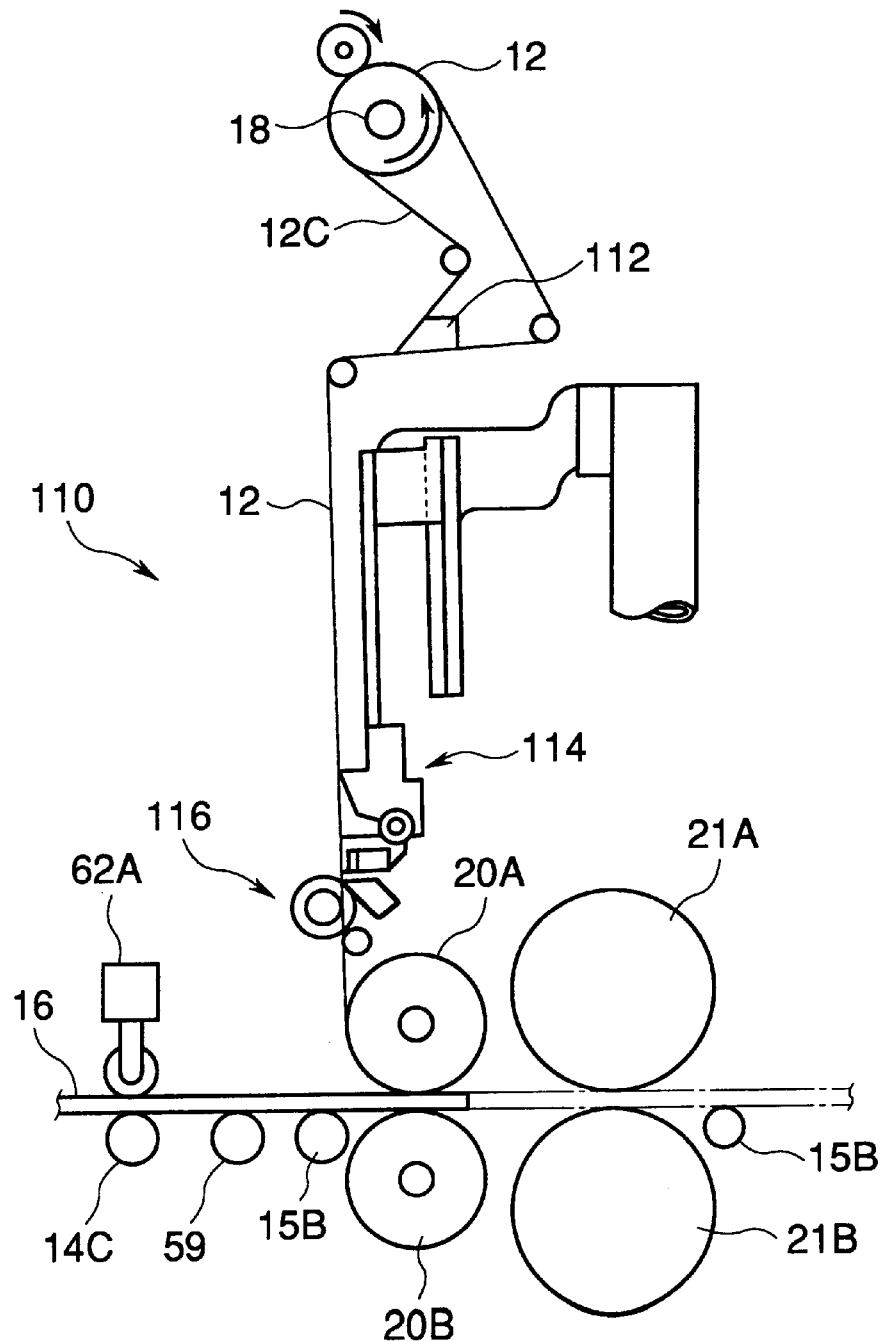
FIG. 13 is a schematic side view showing another embodiment of a film applying apparatus.

The film applying apparatus 10 is so-called continuous applying type where the laminated film 12 is continuously applied to the substrate 16 conveyed continuously at regular intervals, but may be applied also to a film applying apparatus as shown in FIG. 13, where the laminated film in response to the substrate length is cut by a cutter and then applied in each substrate to be applied. After a cover film 12C is continuously separated by a film separating member 112, a laminated film 12 wound out from a film roll 18 is guided to the leading end of each substrate 16 conveyed by a substrate conveying device 14 so that a photosensitive resin layer 12B becomes the substrate side, and the leading end part of the laminated film 12 is sucked by a tacking member 114 movable close and remote from the substrate, and after the leading end of the laminated film 12 is tacked to the leading end of the substrate 16 by the top end of the tacking member 114, while the film is bonded in the preparatory bonding rolls 20A, 20B and the laminating rolls 21A, 21B, the substrate 16 together with the laminated film is conveyed.

As above described, the pressure bonding applying of the laminated film to the substrate 16 is performed so that the applying length becomes length corresponding to the substrate length, and in order to make such length, the laminated film 12 is cut by the film cutting means such as a rotary cutter 116 provided in the film tacking member 114 itself or in the member in the vicinity.

In each embodiment, although the laminating roll is constituted in single stage, this may be constituted in two stages or more.

Further in each embodiment, although the axial length and the substrate width of the laminating roll and the preparatory bonding roll is made 800 mm or more, the present invention is not limited to this, but may be applied also to the case that it is less than 800 mm, 700 mm or more and less than 800 mm for example, and the pushing-down force of the laminating roll for the film applying is large and range of pushing the substrate on the roll surface and performing elastic deformation into a plane shape is large.

According to the knowledge of the inventor, even when the substrate width is 700 mm or more and less, than 800 mm, range of the roll surface pushing the substrate and performing the elastic deformation into a plane shape is large although not large in comparison with the case that the substrate width is 800 mm or more, and holding of an air or the like may be produced. Consequently the present invention is effective even in this range.

Further although each embodiment as above described relates to the case that the laminated film applied to only the upper surface of the substrate, the present invention is not limited to this but can be applied to the case that the laminated film is applied only to the lower surface of the substrate or to both the upper surface and the lower surface.

Figure 14:
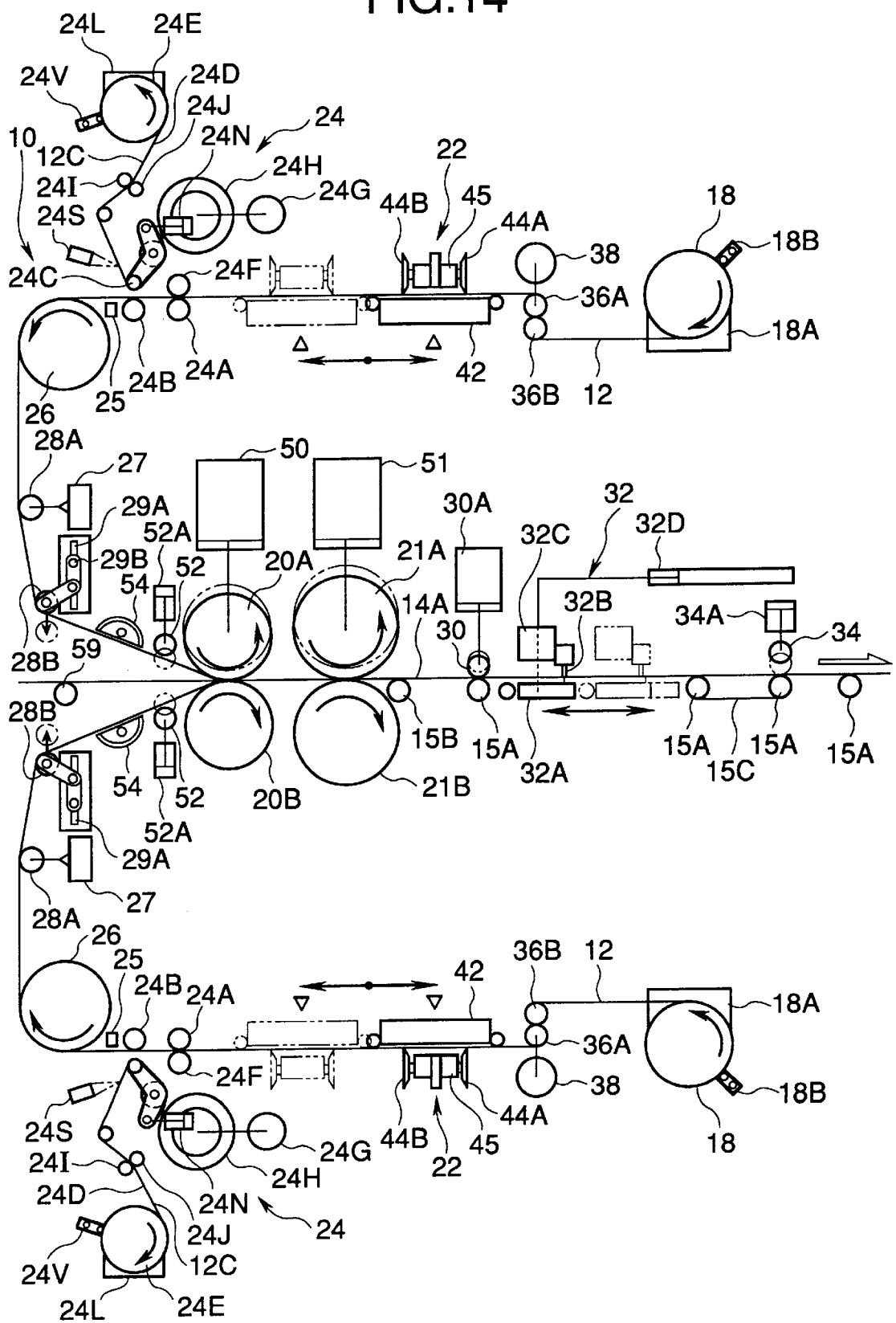
FIG. 14 is a schematic side view showing another more in embodiment of a film applying apparatus.

When the laminated film is applied to only the lower surface of the substrate, each device from the film roll 18 to the film guide roll 52 in FIG. 1 is arranged to the lower side of the substrate conveying plane 14A. Also when the laminated film is applied to both surfaces, as shown in FIG. 14, each device from the film roll 18 to the film guide roll 52 in FIG. 1 is arranged to the upper side and the lower side of the substrate conveying surface 14A.

What is claimed is:

1. A film applying apparatus comprising:

a substrate conveying device for conveying a plurality of substrates along the substrate conveying plane at intervals in sequence;

a film guide means for guiding a laminated film constituted by lamination of at least a photosensitive resin layer onto a light-transmissible support film and having width nearly equal to the substrate width, towards the substrate in the state that the photosensitive resin layer being exposed is directed to one surface of the substrate being conveyed; and a pair of laminating rolls with the touch length being 700 mm or more and having an elastic material laminated on the outer circumference and being heated and rotated, for performing thermal pressure bonding of the laminated film and the substrate at the thermal pressure bonding temperature, while the laminated film and the substrate are grasped and sent, wherein a pair of preparatory bonding rolls having an elastic material laminated on the outer circumference and rotating are installed at the upstream side of the laminating rolls, for press-bonding the laminated film and the substrate at a lower temperature than the thermal pressure bonding temperature and performing the preparatory bonding, while the laminated film and the substrate are grasped and sent, and the diameter in the preparatory bonding rolls at the side of press-bonding the laminated film to the substrate and the pushing-down force at grasping the laminated film and the substrate are specified so that the range of the elastic deformation into a plane shape at contacting with the substrate via the film on the roll surface becomes 5 mm or less in the substrate conveying direction.

2. A film applying apparatus comprising:
- a substrate conveying device for conveying a plurality of substrates along the substrate conveying plane at intervals in sequence;
- a film guide means for guiding a laminated film constituted by lamination of at least a photosensitive resin layer onto a light-transmissible support film and having width nearly equal to the substrate width, towards the substrate in the state that the photosensitive resin layer being exposed is directed to one surface of the substrate being conveyed; and
- a pair of laminating rolls with the touch length being 800 mm or more and having an elastic material laminated on the outer circumference and being heated and rotated, for performing thermal pressure bonding of the laminated film and the substrate at the thermal pressure bonding temperature, while the laminated film and the substrate are grasped and sent,
- wherein a pair of preparatory bonding rolls having an elastic material laminated on the outer circumference and rotating are installed at the upstream side of the laminating rolls, for press-bonding the laminated film and the substrate at a lower temperature than the thermal pressure bonding temperature and performing the preparatory bonding, while the laminated film and the substrate are grasped and sent, and
- the diameter in the preparatory bonding rolls at the side of press-bonding the laminated film to the substrate and the pushing-down force at grasping the laminated film and the substrate are specified so that the range of the elastic deformation into a plane shape at contacting with the substrate via the film on the roll surface becomes 5 mm or less in the substrate conveying direction.

3. A film applying apparatus as set forth in claim 1, wherein the diameter of the preparatory bonding roll is made 50–120 mm.

4. A film applying apparatus as set forth in claim 1, wherein the diameter of the preparatory bonding roll is made 0.1–0.8 times of the diameter of the laminating roll.

5. A film applying apparatus as set forth in claim 1, wherein the diameter of the laminating roll is 110 mm–300 mm.

6. A film applying apparatus as set forth in claim 1, wherein the diameter of the laminating roll is 110 mm–300 mm, and the diameter of the preparatory bonding roll is 0.1–0.8 times of the diameter of the laminating roll.

7. A film applying apparatus as set forth in claim 1, wherein the preparatory bonding roll is a non-heating roll.

8. A film applying apparatus as set forth in claim 1, wherein the preparatory bonding roll is provided with a backup roll rolling contacting from the reverse side with the substrate in parallel.

9. A film applying apparatus as set forth in claim 1, wherein a film cutting device is provided at the downstream side of the laminating roll, for cutting the laminated film in the width direction at the position projecting from the front and rear ends of the substrate, while the substrate and the laminated film applied to this are conveyed.

10. A film applying apparatus as set forth in claim 1, wherein a film cutting device is provided in the position between the preparatory bonding roll and the laminating roll, for cutting the laminated film in the width direction at the position projecting from the front and rear ends of the substrate, while the substrate and the laminated film applied to this are conveyed, and the laminating roll may be detachably mounted on the film cutting device and the preparatory bonding roll.

11. A film applying apparatus, comprising:
- a substrate conveying device for conveying a plurality of substrates along a substrate along a substrate conveying plane at intervals in sequence;
- a film guide means for guiding a laminated film constituted by lamination of at least a photosensitive resin layer onto a light-transmissible support film and having width nearly equal to the substrate width, toward the substrate in the state that the exposed photosensitive resin layer is directed to one surface of the conveyed substrate, wherein the film guide is arranged to the upper side and the lower side of the substrate conveying plane, and the laminated film of the upper side of the lower side is guided by the upper side and the lower side film guide means toward the upper and lower surfaces of the substrate and applied to thereon respectively; and
- a pair of laminating rolls having an elastic material laminated on the outer circumference and being heated and rotated, for performing the thermal pressure bonding of the laminated film and the substrate at the thermal pressure bonding temperature, while the laminated film and the substrate are grasped and set,
- wherein a pair of preparatory bonding rolls having an elastic material laminated on the outer circumference and being rotated are installed at the upstream side of the laminating rolls, for press-bonding the laminated film and the substrate at a temperature lower than the thermal pressure bonding temperature and performing the pressure bonding, while the laminated film and the substrate are grasped and sent, and
- the diameter in the preparatory bonding rolls at the side of press-bonding the laminated film to the substrate and the pushing-down force at grasping the laminated film and the substrate are specified so that the range of the elastic deformation into a plane shape contacting with the substrate via the film at the roll surface becomes 5 mm or less in the substrate conveying direction.

12. A film applying apparatus, comprising:
- a substrate conveying device for conveying a plurality of substrates along a substrate along a substrate conveying plane at intervals in sequence, a film guide means for guiding a laminated film constituted by lamination of at least a photosensitive resin layer onto a light-transmissible support film and having width nearly equal to the substrate width, toward the substrate in the state that the exposed photosensitive resin layer is directed to one surface of the conveyed substrate; and
- a pair of laminating rolls having an elastic material laminated on the outer circumference and being heated and rotated, for performing the thermal pressure bonding of the laminated film and the substrate at the thermal pressure bonding temperature, while the laminated film and the substrate are grasped and set,
- wherein a pair of preparatory bonding rolls having an elastic material laminated on the outer circumference and being rotated are installed at the upstream side of the laminating rolls, for press-bonding the laminated film and the substrate at a temperature lower than the thermal pressure bonding temperature and performing the pressure bonding, while the laminated film and the substrate are grasped and sent, and wherein the diameter of the preparatory bonding roll is made 50–120 mm, the diameter of the preparatory bonding roll is made 0.1–0.8 times of the diameter of the laminating roll, the diameter of the laminating roll is 110 mm–300 mm, and the touch length of the laminating roll and the preparatory bonding roll is 700 mm or more, and the diameter in the preparatory bonding rolls at the side of press-bonding the laminated film to the substrate and the pushing-down force at grasping the laminated film and the substrate are specified so that the range of the elastic deformation into a plane shape contacting with the substrate via the film at the roll surface becomes 5 mm or less in the substrate conveying direction.

13. A film applying apparatus as set forth in claim 12, wherein the preparatory bonding roll is a non-heating roll.

14. A film applying apparatus as set forth in claim 12, wherein the preparatory bonding roll is provided with a backup roll rolling contacting from the reverse side with the substrate in parallel.

15. A film applying apparatus as set forth in claim 12, wherein a film cutting device is provided at the downstream side of the laminating roll, for cutting the laminated film in the width direction at the position projecting from the front and rear ends of the substrate, while the substrate, and the laminated film applied to this are conveyed.

16. A film applying apparatus as set forth in claim 12, wherein a film cutting device is provided in the position between the preparatory bonding roll and the laminating roll, for cutting the laminated film in the width direction at the position projecting from the front and rear ends of the substrate, while the substrate and the laminated film applied to this are conveyed, and the laminating roll may be detachably mounted on the film cutting device and the preparatory bonding roll.

17. A film applying apparatus as set forth in claim 12, wherein the film guide is arranged to the upper side and the lower side of the substrate conveying plane, and the laminated film of the upper side and of the lower side is guided by the upper side and the lower side film guide means toward the upper and lower surfaces of the substrate and applied to thereon respectively.

* * * * *